US008873296B2

(12) United States Patent
Itagaki et al.

(10) Patent No.: US 8,873,296 B2
(45) Date of Patent: *Oct. 28, 2014

(54) NONVOLATILE SEMICONDUCTOR MEMORY DEVICE

(71) Applicant: Kabushiki Kaisha Toshiba, Minato-ku (JP)

(72) Inventors: Kiyotaro Itagaki, Naka-gun (JP); Masaru Kito, Kuwana (JP); Ryu Ogiwara, Yokohama (JP); Hitoshi Iwai, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,376

(22) Filed: Jul. 29, 2013

(65) Prior Publication Data

US 2013/0314994 A1    Nov. 28, 2013

Related U.S. Application Data

(63) Continuation of application No. 13/235,389, filed on Sep. 18, 2011, now Pat. No. 8,514,627.

(30) Foreign Application Priority Data

Sep. 22, 2010  (JP) .............................. 2010-212861

(51) Int. Cl.
*G11C 16/04* (2006.01)
*H01L 27/115* (2006.01)
*G11C 16/10* (2006.01)
*G11C 16/16* (2006.01)

(52) U.S. Cl.
CPC .......... *G11C 16/10* (2013.01); *H01L 27/11565* (2013.01); *G11C 16/0483* (2013.01); *H01L 27/1157* (2013.01); *H01L 27/11582* (2013.01); *H01L 27/11573* (2013.01); *G11C 16/16* (2013.01)
USPC .............. 365/185.18; 365/185.29; 365/185.3; 365/218

(58) Field of Classification Search
CPC ........ G11C 16/10; G11C 16/16; G11C 16/26; G11C 16/0483
USPC ..................... 365/185.18, 185.29, 185.3, 218
See application file for complete search history.

(56) References Cited

U.S. PATENT DOCUMENTS

| 7,698,615 | B2  |   | 4/2010 | Kang et al.                   |
|-----------|-----|---|--------|-------------------------------|
| 7,881,106 | B2  |   | 2/2011 | Sukegawa                      |
| 8,154,924 | B2  | * | 4/2012 | Park et al. ......... 365/185.05 |
| 8,189,391 | B2  |   | 5/2012 | Itagaki et al.                |
| 8,223,541 | B2  |   | 7/2012 | Shirota                       |
| 8,432,737 | B2  | * | 4/2013 | Shiga ............... 365/185.09 |
| 8,514,627 | B2  | * | 8/2013 | Itagaki et al. ...... 365/185.18 |
| 8,537,615 | B2  | * | 9/2013 | Maeda ............. 365/185.11 |

FOREIGN PATENT DOCUMENTS

WO    WO 2010/035609 A1    4/2010

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A control circuit is configured to execute an erasing operation on a selected cell unit in a selected memory block. In the erasing operation, the control circuit raises the voltage of the bodies of the first memory transistors included in the selected cell unit to a first voltage, sets the voltage of the bodies of the first memory transistors included in the non-selected cell unit to a second voltage lower than the first voltage, and applies a third voltage equal to or lower than the second voltage to the gates of the first memory transistors included in the selected cell unit and the non-selected cell unit.

7 Claims, 30 Drawing Sheets

FIG. 8   Erasing Operation is Executed on Selected Cell Unit s-MU in Selected Memory Block s-MB Erasing Operation is Prohibited on Non-Selected Memory Block ns-MB
▷ Hole
● Electron FIG. 23 Erasing Operation is Executed on Selected Cell Unit s-MU in Selected Memory Block s-MB

US 8,873,296 B2

NONVOLATILE SEMICONDUCTOR MEMORY DEVICE

CROSS REFERENCE TO RELATED APPLICATIONS

This application is a continuation of U.S. application Ser. No. 13/235,389 filed Sep. 18, 2011, now U.S. Pat. No. 8,514,627, and is based on and claims the benefit of priority from prior Japanese Patent Application No. 2010-212861, filed on Sep. 22, 2010, the entire contents of each of which are incorporated herein by reference.

FIELD

Embodiments described herein relate generally to an electrically-data-rewritable nonvolatile semiconductor memory device.

BACKGROUND

What is considered for a prospective technique for improving the bit density of nonvolatile semiconductor memory devices such as NAND type flash memories is stacking of memory cells because miniaturizing techniques have almost come to their limit. As one example of the stacking technique, a stacked NAND type flash memory using memory transistors configured by vertical transistors is proposed. A stacked NAND type flash memory includes memory strings each configured by a plurality of memory transistors connected in series in the stacking direction, and select transistors provided at both ends of each memory string.

As has been conventionally required, simplification of the manufacturing process is required also for this stacked NAND type flash memory, in order to save the manufacturing cost. However, the simplification of the manufacturing process requires that the gates of memory transistors included in a plurality of memory strings be connected commonly to one word line WL. Therefore, an erasing operation of erasing data in the memory transistors can only be executed simultaneously on the basis of all the memory strings connected by one word line WL (i.e., on a block basis).

BRIEF DESCRIPTION OF THE DRAWINGS

FIG. 5 is a top view showing word line conductive layers 31a.

DETAILED DESCRIPTION

Figure 1:
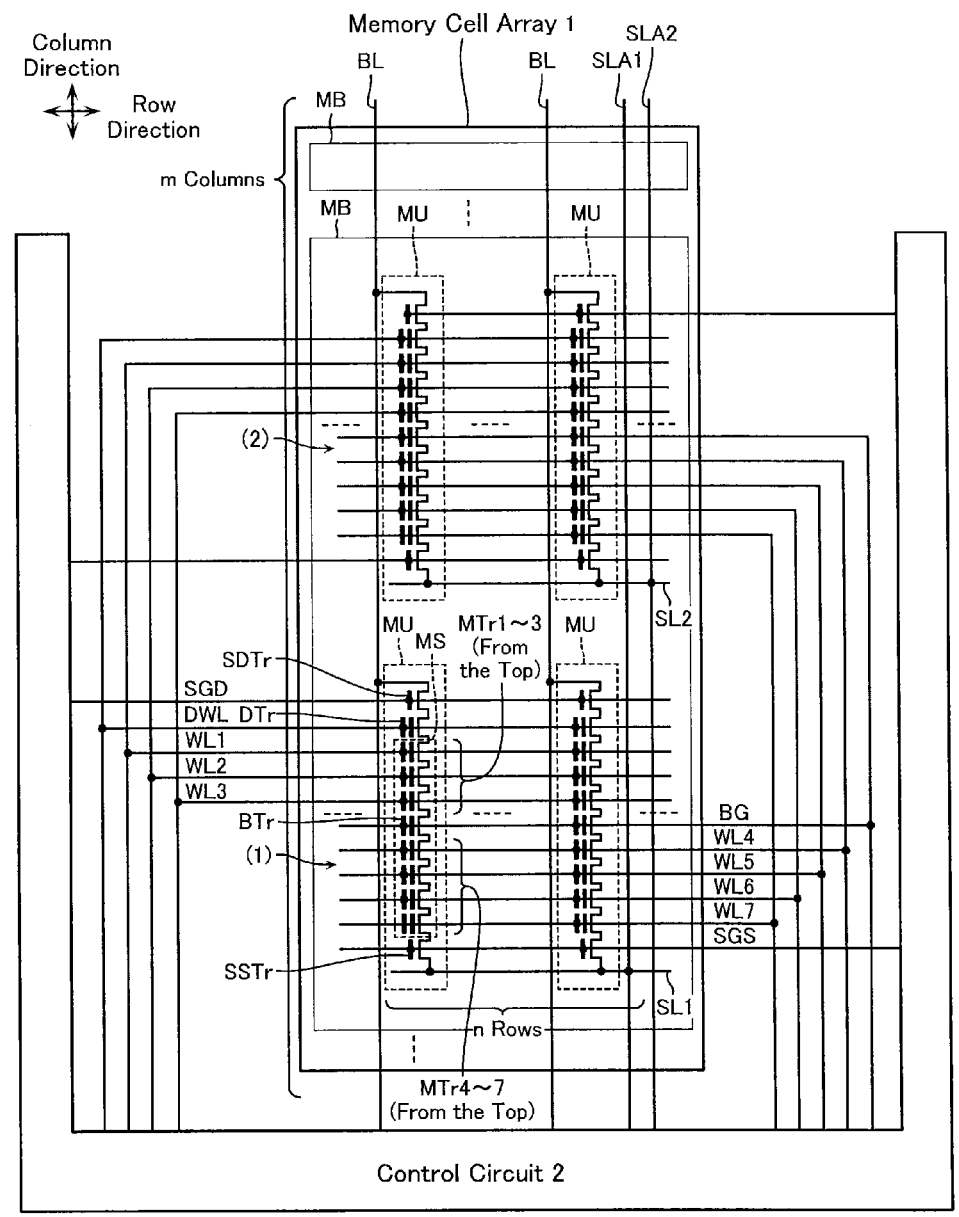
FIG. 1 is a diagram showing a memory cell array 1 and a control circuit 2 of a nonvolatile semiconductor memory device according to a first embodiment.

A nonvolatile semiconductor memory device according to one embodiment includes a plurality of memory blocks, first lines, second lines, and a control circuit. The plurality of memory blocks includes a plurality of cell units. The first lines are each provided commonly for the plurality of memory blocks and each connected to first terminals of plural ones of the cell units. The second lines are each connected to second terminals of plural ones of the cell units. The control circuit controls signals to be supplied to the cell units. Each of the plurality of cell units includes a memory string, a second memory transistor, a first transistor, and a second transistor. The memory string is including a plurality of electrically-rewritable stacked first memory transistors connected in series. The second memory transistor is connected at its one terminal to one terminal of the memory string. The first transistor is connected between the other terminal of the second memory transistor and the first line. The second transistor is connected between the other terminal of the memory string and the second line. The control circuit is configured to execute an erasing operation on a selected cell unit in a selected memory block. In an erasing operation, the control circuit raises the voltage of the bodies of the first memory transistors included in the selected cell unit to a first voltage. For this purpose, the control circuit is configured to be capable of executing, in an erasing operation, an operation of generating a GIDL current by setting the voltage of the second line connected to the selected cell unit higher than the voltage of the gate of the second transistor included in the selected cell unit. The control circuit is also configured to be capable of executing, in an erasing operation, an operation of setting the voltage of the gate of the second memory transistor included in the selected cell unit equal to or higher than the voltage of the second line connected to the selected cell unit. The control circuit is also configured to be capable of executing, in an erasing operation, an operation of setting the voltage of the gate of the first transistor included in the selected cell unit equal to or lower than the voltage of the first line connected to the selected cell unit. In an erasing operation, the control circuit sets the voltage of the bodies of the first memory transistors included in a non-selected cell unit to a second voltage lower than the first voltage. For this purpose, the control circuit is configured to be capable of executing, in an erasing operation, an operation of suppressing generation of a GIDL current by setting the voltage of the gate of the second transistor included in the non-selected cell unit equal to or higher than the voltage of the second line connected to the non-selected cell unit. The control circuit is also configured to be capable of executing, in an erasing operation, an operation of suppressing generation of a GIDL current by setting the voltage of the gate of the first transistor included in the non-selected cell unit equal to or higher than the voltage of the first line connected to the non-selected cell unit. The control circuit is also configured to be capable of executing, in an erasing operation, an operation of applying a third voltage equal to or lower than the second voltage to the gates of the first memory transistors included in the selected cell unit and the non-selected cell unit.

The embodiments of a nonvolatile semiconductor memory device will be explained with reference to the drawings.

First Embodiment

A schematic configuration of a nonvolatile semiconductor memory device according to a first embodiment will be explained with reference to FIG. 1. As shown in FIG. 1, the nonvolatile semiconductor memory device according to the first embodiment includes a memory cell array 1 and a control circuit 2. The control circuit 2 controls a signal to be supplied to the memory cell array 1. A specific configuration of the control circuit 2 will be described later with reference to FIG. 14.

As shown in FIG. 1, the memory cell array 1 includes n number of bit lines BL, two common source lines SLA1 and SLA2, and m columns of memory blocks MB.

The bit lines BL have a certain pitch between them in a row direction and are formed to extend in a column direction by traversing a plurality of memory blocks MB. In each memory block MB, one bit line BL is shared by two cell units MU adjoining each other in the column direction. The common source lines SLA1 and SLA2 have a certain pitch between them in the row direction and are formed to extend in the column direction by traversing a plurality of memory blocks MB.

Memory blocks MB are provided repeatedly in the column direction with a certain pitch between them. Each memory block MB includes n rows×2 columns of cell units MU and two source lines SL1 and SL2.

A cell unit MU includes a memory string MS, a memory transistor DTr, a drain-side select transistors SDTr, and a source-side select transistor SSTr. The memory transistor DTr is connected to the drain of the memory string MS. The memory transistor DTr has the same configuration as memory transistors MTr1 to MTr7 included in the memory string MS. However, the role of the memory transistor DTr is different from the memory transistors MTr1 to MTr7. Hence, to facilitate the explanation, the "memory transistor DTr" will hereinafter be referred to as "dummy transistor DTr". The drain-side select transistor SDTr is provided between the drain of the dummy transistor DTr and the bit line BL. The source-side select transistor SSTr is provided between the source of the memory string MS and the source line SL1 (or SL2). In the example shown in FIG. 1, a first column of cell units MU will be indicated as (1) and the second column of cell units MU will be indicated as (2).

Figure 2:
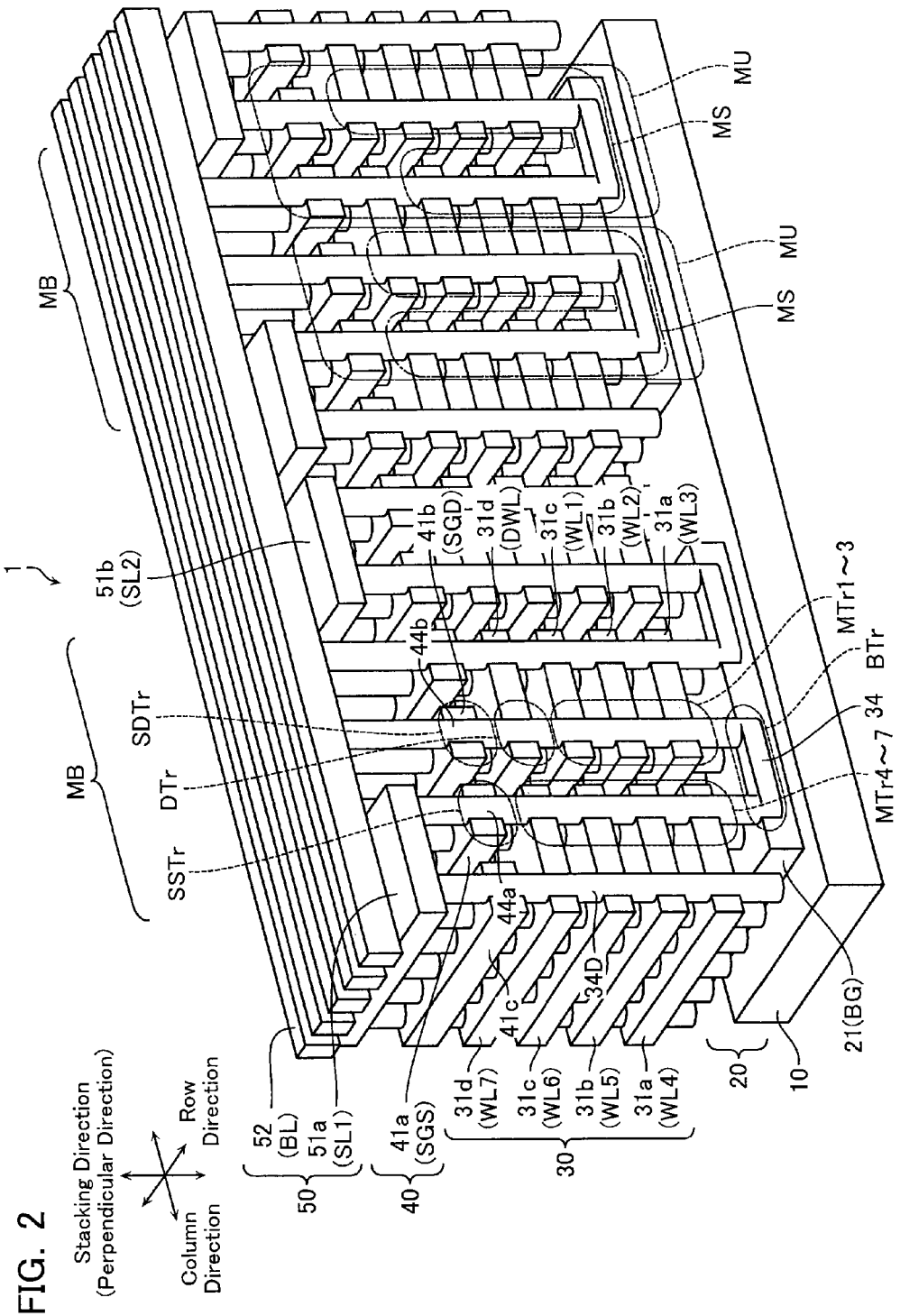
FIG. 2 is a perspective diagram showing a stacked configuration of the memory cell array 1 according to the first embodiment.

As shown in FIG. 2 to be mentioned later, the memory string MS, the dummy transistor DTr, the drain-side select transistor SDTr, and the source-side select transistor SSTr are arranged in a three-dimensional matrix formation. That is, they are arranged in a matrix formation in the horizontal direction and at the same time are arranged in the stacking direction (a direction perpendicular to the substrate).

As shown in FIG. 1, the memory string MS is configured by memory transistors MTr1 to MTr7 connected in series and a back gate transistor BTr. The memory transistors MTr1 to MTr3 are connected in series, and the memory transistors MTr4 to MTr7 are connected in series likewise. The threshold voltage of the memory transistors MTr1 to MTr7 changes when the amount of charges accumulated in their charge accumulation layers changes. The change of the threshold voltage causes the data retained by the memory transistors MTr1 to MTr7 to be rewritten. The back gate transistor BTr is connected between the memory transistor MTr3 and the memory transistor MTr4.

The gates of 2×n memory transistors MTr1 in one memory block MB are connected commonly to one word line WL1. Likewise, the gates of 2×n memory transistors MTr2 to 2×n memory transistors MTr7 in one memory block MB are connected commonly to one word line WL2 to one word line WL7 respectively. The gates of 2×n back gate transistors BTr in one memory block MB are connected commonly to one back gate line BG.

The dummy transistor DTr is not used for data storage but is used for controlling the voltage of the bodies of the memory transistors MTr1 to MTr7. Hence, it is preferable that the dummy transistor DTr not include a charge accumulation layer. However, for simplification of the manufacturing process, in the present embodiment, the dummy transistor DTr includes a charge accumulation layer like the memory transistors MTr1 to MTr7. The gates of 2×n dummy transistors DTr in one memory block MB are connected commonly to one dummy word line DWL.

The gates of the n drain-side select transistors SDTr arranged in one line in the row direction are connected commonly to one drain-side select gate line SGD extending in the row direction. The drains of the drain-side select transistors SDTr arranged in one line in the column direction are connected commonly to one bit line BL extending in the column direction.

The gates of the n source-side select transistors SSTr arranged in one line in the row direction are connected commonly to one source-side select gate line SGS extending in the row direction. The sources of the source-side select transistors SSTr located in the first column (1) are connected to the common source line SLA1 through the source line SL1 extending in the row direction. The sources of the source-side select transistors SSTr located in the second column (2) are connected to the common source line SLA2 through the source line SL2 extending in the row direction.

Figure 3:
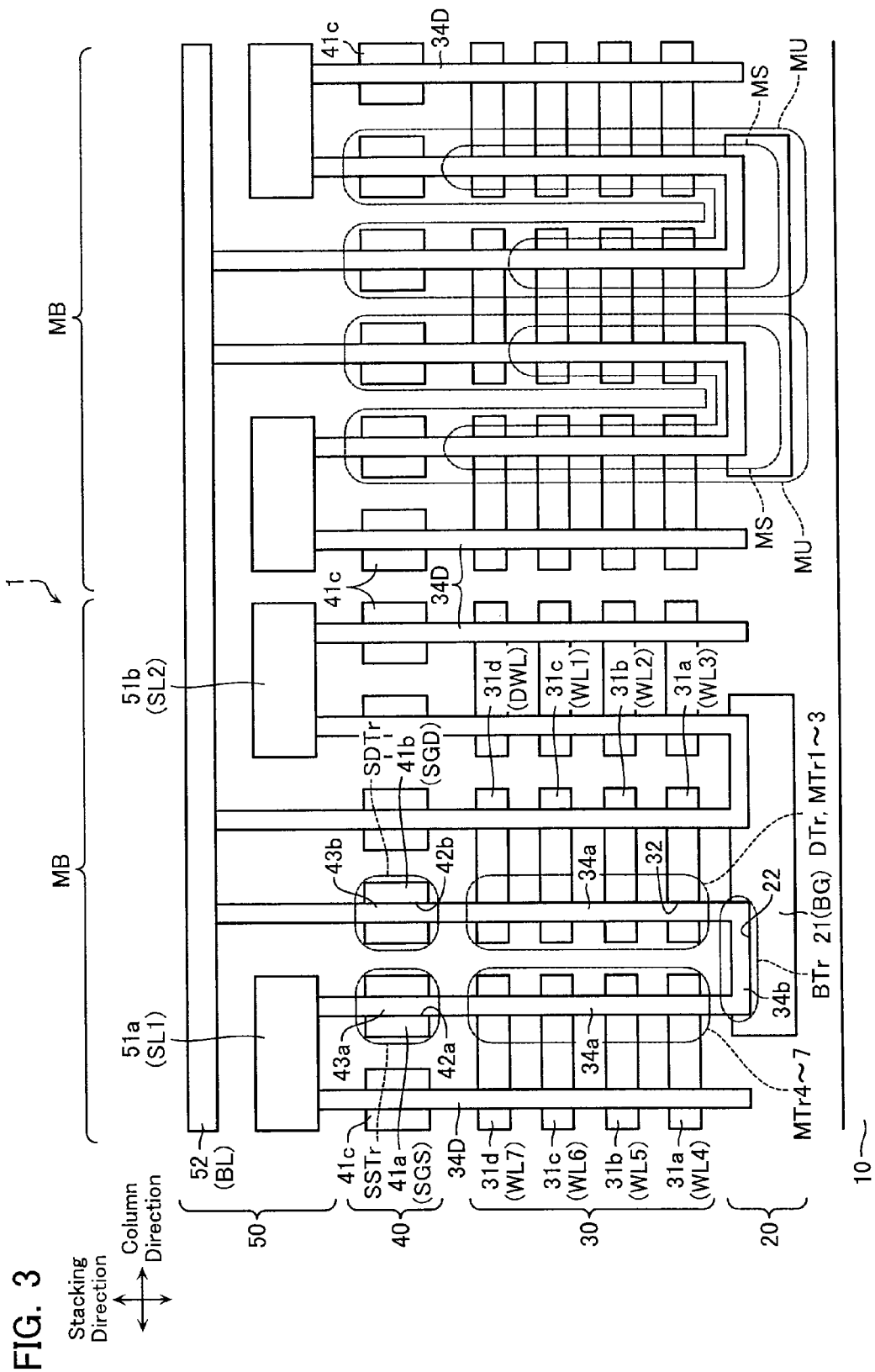
FIG. 3 is a cross-sectional diagram showing a stacked configuration of the memory cell array 1 according to the first embodiment.

Next, the stacked configuration of the memory cell array 1 will be explained with reference to FIG. 2 to FIG. 4. As shown in FIG. 2 and FIG. 3, the memory cell array 1 according to the first embodiment includes a back gate layer 20, a memory layer 30, a select transistor layer 40, and an interconnection layer 50 stacked sequentially on a semiconductor substrate 10. The back gate layer 20 functions as the back gate transistor BTr. The memory layer 30 functions as the memory transistors MTr1 to MTr7 and the dummy transistor DTr. The select transistor layer 40 functions as the drain-side select transistor SDTr and the source-side select transistor SSTr. The interconnection layer 50 functions as the source line SL and the bit line BL.

As shown in FIG. 2 and FIG. 3, the back gate layer 20 includes a back gate conductive layer 21. The back gate conductive layer 21 is formed to spread two-dimensionally in the row direction and the column direction parallel with the substrate 10. The back gate conductive layer 21 is made of polysilicon (poly-Si).

As shown in FIG. 3, the back gate layer 20 has back gate holes 22. The back gate holes 22 are formed to dig into the back gate conductive layer 21. When seen from above, the back gate holes 22 are formed approximately in a rectangular shape having its longer direction in the column direction. The back gate holes 22 are formed in a matrix formation in the row direction and the column direction.

As shown in FIG. 2 and FIG. 3, the memory layer 30 is formed above the back gate layer 20. The memory layer 30 includes word line conductive layers 31a to 31d. The word line conductive layers 31a function as the word lines WL3 and WL4 and the gates of the memory transistors MTr3 and MTr4. The word line conductive layers 31b function as the word lines WL2 and WL5 and the gates of the memory transistors MTr2 and MTr5. The word line conductive layers 31c function as the word lines WL1 and WL6 and the gates of the memory transistors MTr1 and MTr6. The word line conductive layers 31d function as the dummy word line DWL, the word line WL7, and the gates of the dummy transistor DTr and memory transistor MTr7.

The word line conductive layers 31a to 31d are stacked one above another with an inter-layer insulating layer (unillustrated) between them. The word line conductive layers 31a to 31d are formed to extend in the row direction with a certain pitch between themselves in the column direction. The word line conductive layers 31a to 31d are made of polysilicon (poly-Si).

As shown in FIG. 3, the memory layer 30 has memory holes 32. The memory holes 32 are formed to penetrate the word line conductive layers 31a to 31d and the inter-layer insulating layers. The memory holes 32 are formed to nearly coincide with the column-direction ends of the back gate hole 22.

As shown in FIG. 2 and FIG. 3, the back gate layer 20 and the memory layer 30 include a memory semiconductor layer 34. The memory semiconductor layer 34 functions as the bodies of the memory transistors MTr1 to MTr7 (the memory string MS) and the body of the dummy transistor DTr.

The memory semiconductor layer 34 is formed to fill the back gate hole 22 and the memory holes 32. That is, the memory semiconductor layer 34 is formed in a U-letter shape when seen in the row direction. The memory semiconductor layer 34 has a pair of columnar portions 34a extending in a direction perpendicular to the substrate 10 and a linking portion 34b linking the lower ends of the pair of columnar portions 34a. The memory semiconductor layer 34 is made of polysilicon (poly-Si).

Figure 4:
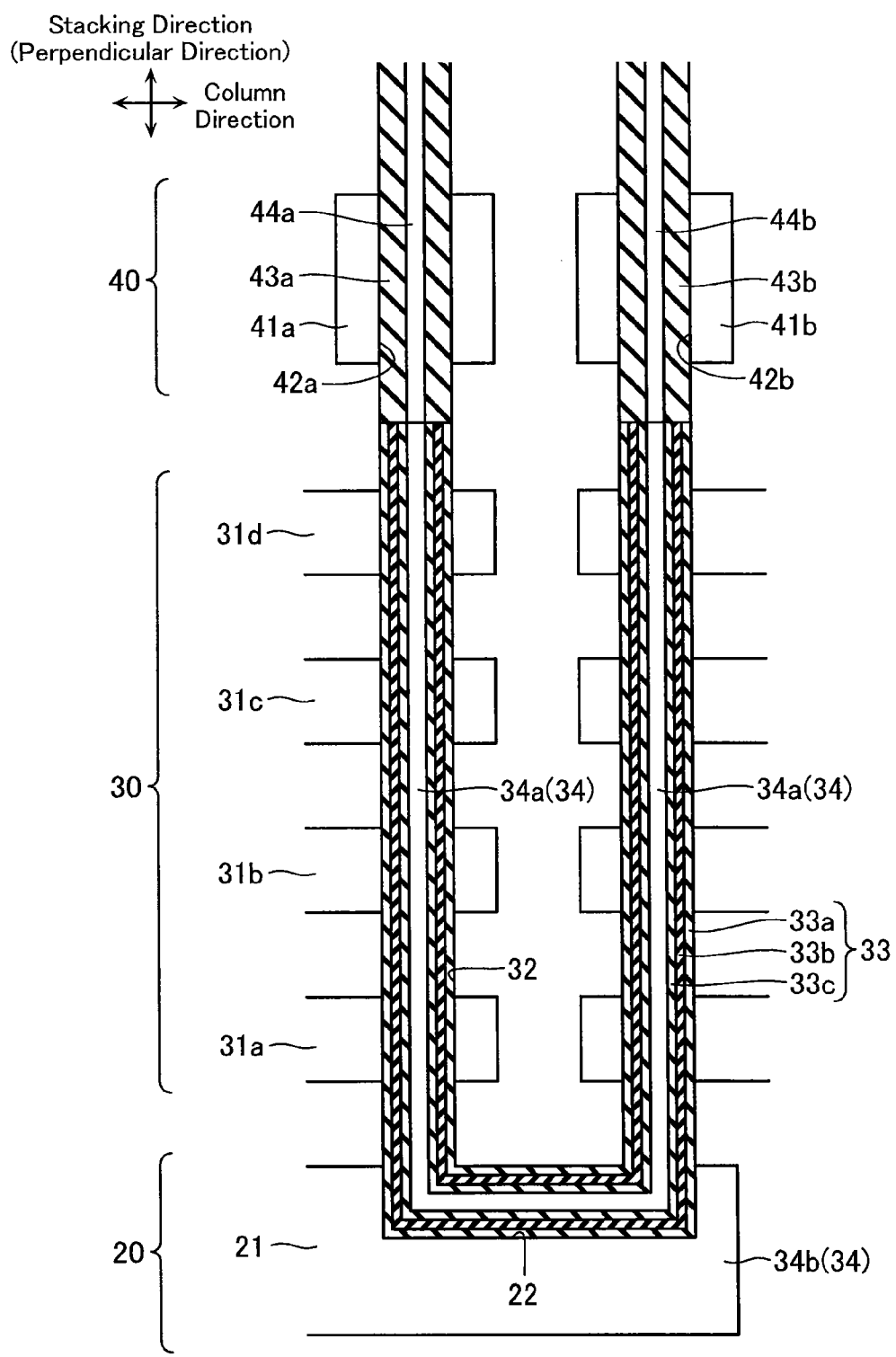
FIG. 4 is an enlarged diagram of a portion of FIG. 3.

As shown in FIG. 4, the back gate layer 20 and the memory layer 30 include a memory gate insulating layer 33. The memory gate insulating layer 33 is formed between the memory semiconductor layer 34 and the word line conductive layers 31a to 31d (the back gate conductive layer 21). The memory gate insulating layer 33 includes a block insulating layer 33a, a charge accumulation layer 33b, and a tunnel insulating layer 33c.

As shown in FIG. 4, the block insulating layer 33a is formed on the side surfaces of the back gate hole 22 and memory holes 32 to have a certain thickness. The charge accumulation layer 33b is formed on the side surface of the block insulating layer 33a to have a certain thickness. The tunnel insulating layer 33c is formed on the side surface of the charge accumulation layer 33b to have a certain thickness. The block insulating layer 33a and the tunnel insulating layer 33c are made of silicon oxide ($SiO_2$). The charge accumulation layer 33b is made of silicon nitride (SiN) and accumulates charges therein.

To put the configuration of the above-described back gate layer 20 in other words, the back gate conductive layer 21 is formed to surround the linking portion 34b through the memory gate insulating layer 33. To put the configuration of the above-described memory layer 30 in other words, the word line conductive layers 31a to 31d are formed to surround the columnar portions 34a through the memory gate insulating layer 33.

There is also formed in parallel with the memory semiconductor layer 34 a dummy memory semiconductor layer 34D which does not function as a memory string MS. The dummy memory semiconductor layer 34D is a semiconductor layer which is essentially unnecessary but provided for maintaining lithographical regularities. The dummy memory semiconductor layer 34D is formed to traverse the memory layer 30 and the select transistor layer 40.

As shown in FIG. 2 and FIG. 3, the select transistor layer 40 includes a source-side conductive layer 41a, a drain-side conductive layer 41b, and a dummy conductive layer 41c. The source-side conductive layer 41a functions as the source-side select gate line SGS and the gate of the source-side select transistor SSTr. The drain-side conductive layer 41b functions as the drain-side select gate line SGD and the gate of the drain-side select transistor SDTr. The dummy conductive layer 41c is a dummy line provided for maintaining lithographical regularities, and is provided to surround the dummy memory semiconductor layer 34D.

The source-side conductive layer 41a is formed at about the upper end of one columnar portion 34a constituting the memory semiconductor layer 34, and the drain-side conductive layer 41b is in the same layer as the source-side conductive layer 41a and formed at about the upper end of the other columnar portion 34a constituting the memory semiconductor layer 34. The source-side conductive layer 41a and the drain-side conductive layer 41b are made of polysilicon (poly-Si).

As shown in FIG. 2 and FIG. 3, the select transistor layer 40 has a source-side hole 42a and a drain-side hole 42b. The source-side hole 42a is formed to penetrate the source-side conductive layer 41a. The drain-side hole 42b is formed to penetrate the drain-side conductive layer 41b. The source-side hole 42a and the drain-side hole 42b are formed at positions coinciding with the memory holes 32 respectively.

As shown in FIG. 2 and FIG. 3, the select transistor layer 40 includes a source-side columnar semiconductor layer 44a and a drain-side columnar semiconductor layer 44b. The source-side columnar semiconductor layer 44a functions as the body of the source-side select transistor SSTr. The drain-side columnar semiconductor layer 44b functions as the body of the drain-side select transistor SDTr.

The source-side columnar semiconductor layer 44a is formed to fill the source-side hole 42a. That is, the source-side columnar semiconductor layer 44a is formed in a columnar shape contacting the upper surface of one of the pair of columnar portions 34a and extending in the direction perpendicular to the substrate 10. The source-side columnar semiconductor layer 44a is made of polysilicon (poly-Si).

The drain-side columnar semiconductor layer 44b is formed to fill the drain-side hole 42b. That is, the drain-side columnar semiconductor layer 44b is formed in a columnar shape contacting the upper surface of the other of the pair of columnar portions 34a and extending in the direction perpendicular to the substrate 10. The drain-side columnar semiconductor layer 44b is made of polysilicon (poly-Si).

As shown in FIG. 4, the select transistor layer 40 also includes a source-side gate insulating layer 43a and a drain-side gate insulating layer 44b. The source-side gate insulating layer 43a is provided between the source-side columnar semiconductor layer 44a and the source-side conductive layer 41a. The drain-side gate insulating layer 43b is provided between the drain-side columnar semiconductor layer 44b and the drain-side conductive layer 41b. The source-side gate insulating layer 43a and the drain-side gate insulating layer 43b are made of silicon oxide ($SiO_2$).

As shown in FIG. 2 and FIG. 3, the interconnection layer 50 includes source layers 51a and 51b and a bit layer 52. The source layers 51a and 51b function as the source lines SL1 and SL2 respectively. The bit layer 52 functions as the bit line BL.

The source layers 51a and 51b are formed to contact the upper surface of the source-side columnar semiconductor layers 44a respectively and extend in the row direction. Each memory block MB includes one source layer 51a and one source layer 51b, which have a certain pitch between them in the column direction. The bit layer 52 is formed to contact the upper surface of the drain-side columnar semiconductor layers 44b and extend in the column direction. The source layers 51a and 51b and the bit layer 52 are made of a metal such as tungsten.

Next, the shape of the word line conductive layers 31a will be explained in detail with reference to FIG. 5. The shape of the word line conductive layers 31b to 31d is the same as that of the word line conductive layers 31a, and hence explanation about their shape will not be provided.

Figure 5:
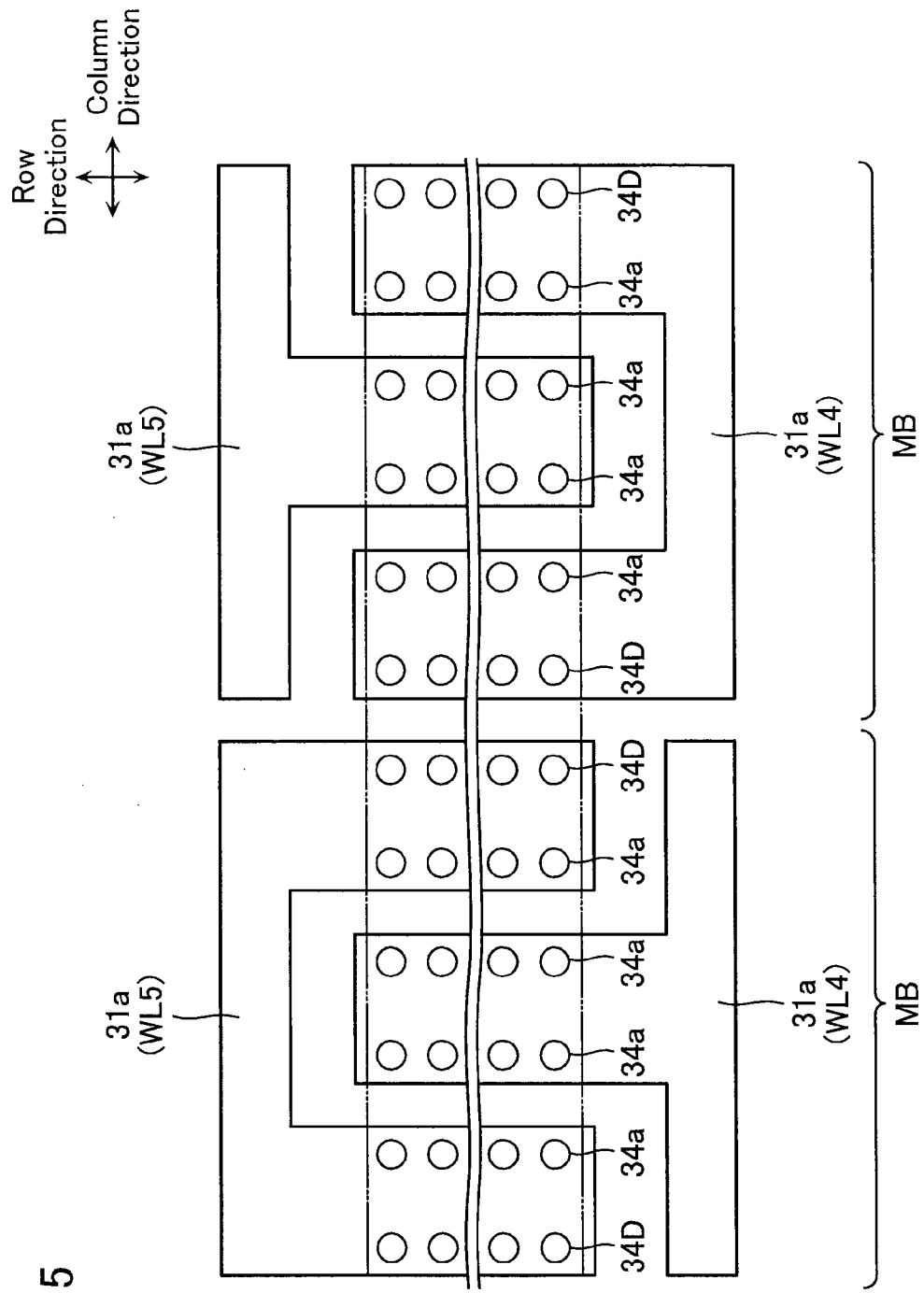

As shown in FIG. 5, the word line conductive layers 31a are provided in a pair in one memory block MB. One word line conductive layer 31a is formed in a T-letter shape (a convex shape) when seen from above. The other word line conductive layer 31a is formed in a U-letter shape (a concave shape) to face the T-letter-shaped word line conductive layer 31a.

Next, the shape of the source-side conductive layer 41a and drain-side conductive layer 41b will be explained in detail with reference to FIG. 6.

Figure 6:
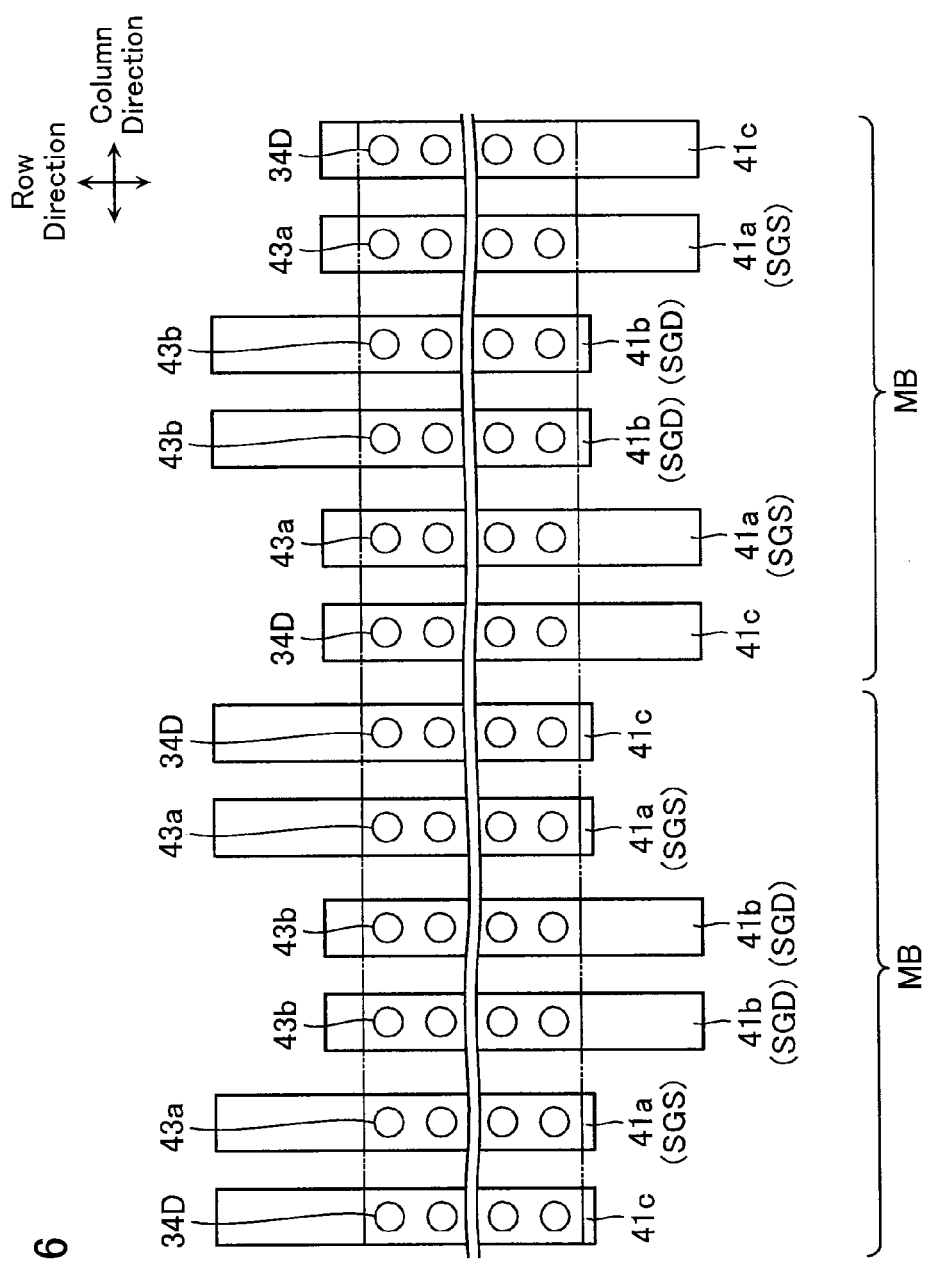
FIG. 6 is a top view showing source-side conductive layers and drain-side conductive layers 41b.

As shown in FIG. 6, the source-side conductive layer 41a and the drain-side conductive layer 41b are formed to extend in the row direction. One memory block MB includes one pair of source-side conductive layers 41a and one pair of drain-side conductive layers 41b. The source-side conductive layers 41a are provided near column-direction both ends of the memory block MB, and the drain-side conductive layers 41b are provided between the one pair of source-side conductive layers 41a.

Figure 7:
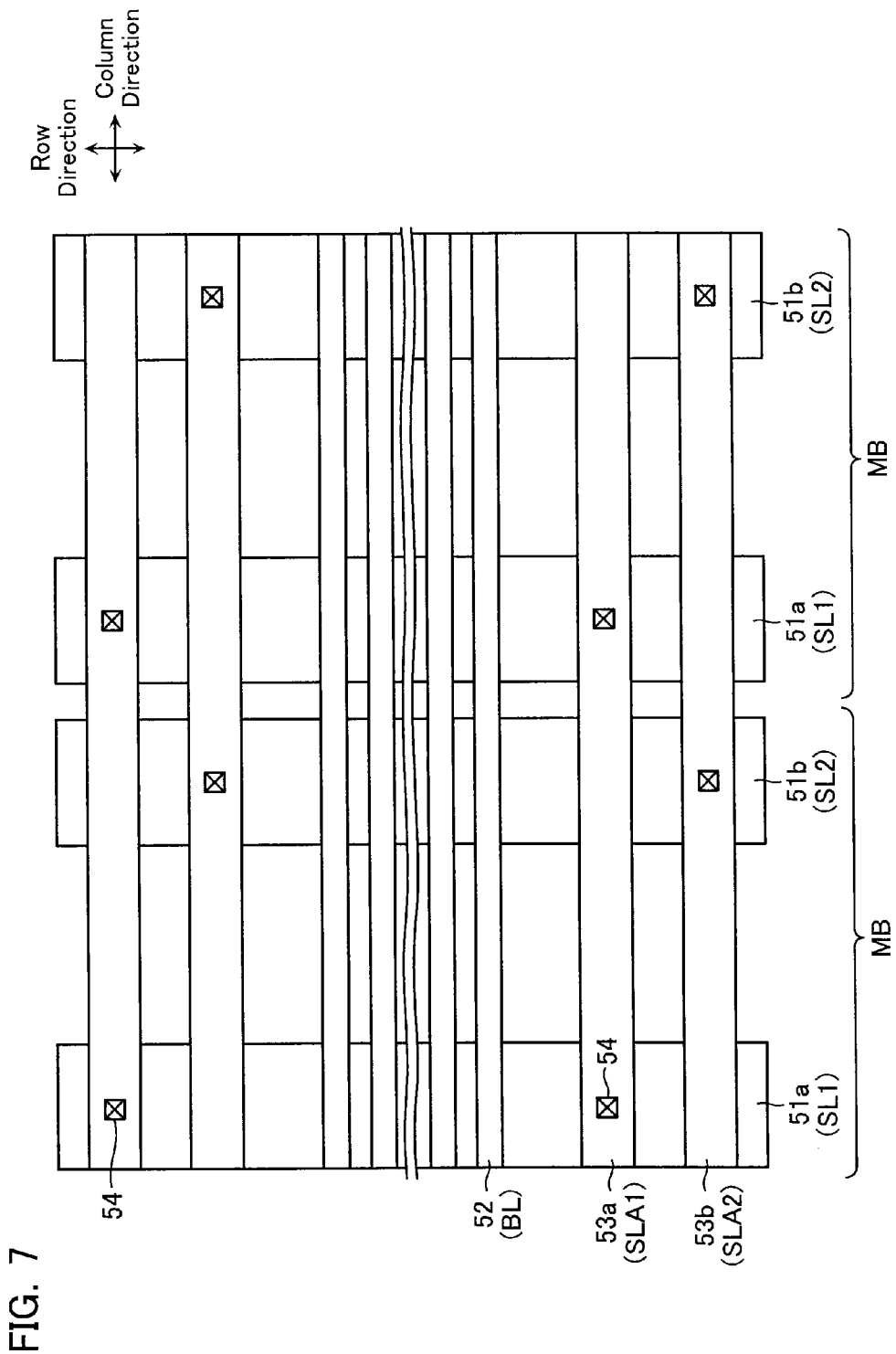
FIG. 7 is a top view showing source layers 51a and 51b, bit layers 52, and common source layers 53a and 53b.

Next, the shape of the source layers 51a and 51b will be explained in detail with reference to FIG. 7.

The source layers 51a and 51b are formed to extend in the row direction with a certain pitch between them in the column direction. One memory block MB includes one source layer 51a and one source layer 51b. Common source layers 53a and 53b are provided above the source layers 51a and 51b to extend in the column direction. The source layers 51a and the source layers 51b included in a plurality of memory blocks MB are connected commonly to one common source layer 53a and one common source layer 53b respectively through plug layers 54. The common source layers 53a and 53b function as the common source lines SLA1 and SLA2 respectively.

Next, an erasing operation of the nonvolatile semiconductor memory device according to the first embodiment will be explained. In the first embodiment, the control circuit 2 executes an erasing operation on a selected cell unit MU (hereinafter referred to as selected cell unit s-MU) in a selected memory block MB (hereinafter referred to as selected memory block s-MB). On the other hand, the control circuit 2 prohibits an erasing operation on a non-selected cell unit MU (hereinafter referred to as non-selected cell unit ns-MU) in the selected memory block s-MB. Note that an erasing operation is an operation for discharging the charges accumulated in the charge accumulation layers of the memory transistors MTr1 to MTr7.

Figure 8:
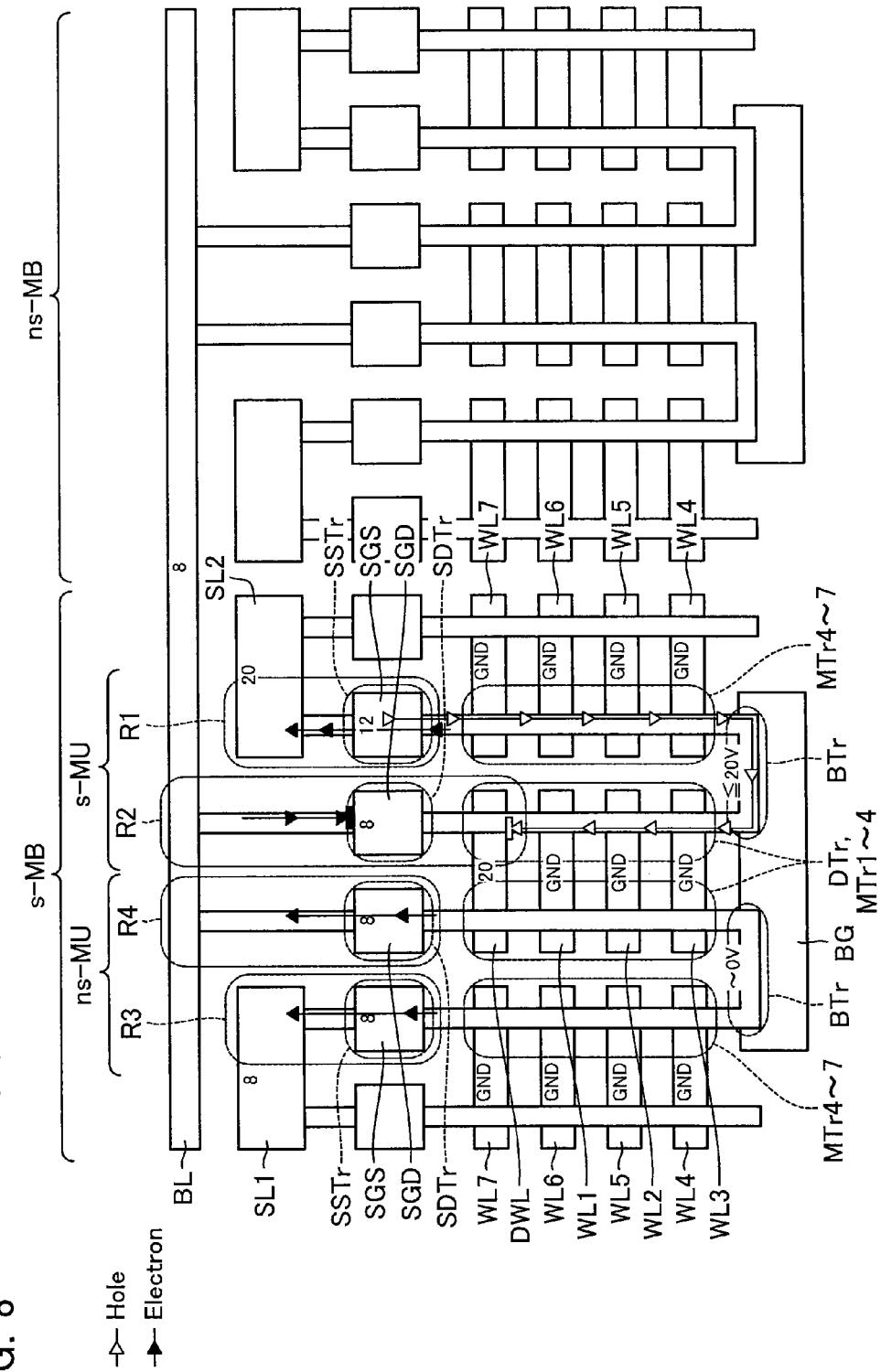
FIG. 8 is a diagram showing one example of executing an erasing operation on a selected cell unit s-MU in a selected memory block s-MU according to the first embodiment.

First, a control on the selected memory block s-MB will be explained with reference to FIG. 8. As shown in FIG. 8, in the erasing operation, the control circuit 2 raises the voltage of the bodies of the memory transistors MTr1 to MTr7 included in the selected cell unit s-MU to 20 V. On the other hand, in the erasing operation, the control circuit 2 sets the voltage of the bodies of the memory transistors MTr1 to MTr7 included in the non-selected cell unit ns-MU to 0 V. In the erasing operation, the control circuit 2 sets the voltage of the gates of the memory transistors MTr1 to MTr7 included in the selected cell unit s-MU and the non-selected cell unit ns-MU to 0 V (GND). This causes a high voltage to be applied to the charge accumulation layers of the memory transistors MTr1 to MTr7 in the selected cell unit s-MU, thereby discharging the charges in these charge accumulation layers to the channel side. On the other hand, no high voltage is applied to the charge accumulation layers of the memory transistors MTr1 to MTr7 in the non-selected cell unit ns-MU, discharging no charges from these charge accumulation layers.

Next, the above-described process of raising the voltage of the bodies of the memory transistors MTr1 to MTr7 included in the selected cell unit s-MU to 20 V will be explained.

Figure 9:
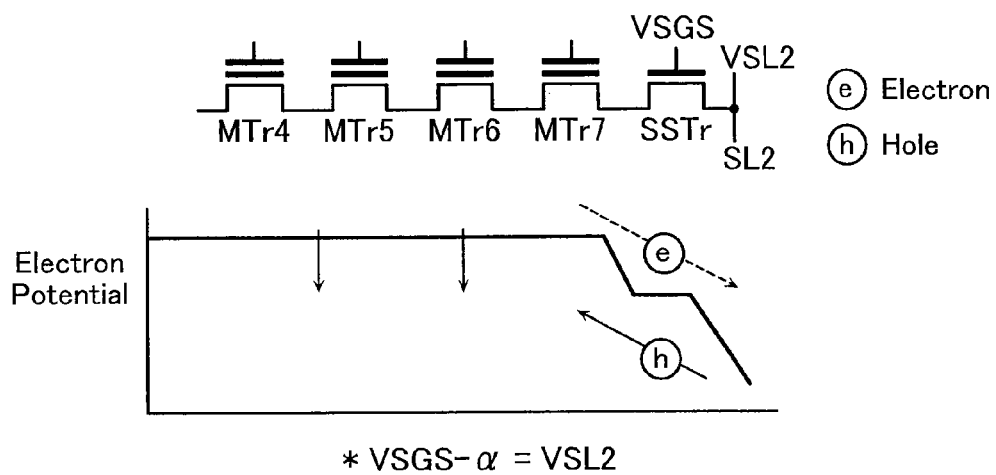
FIG. 9 is a diagram showing potential in a region R1 of FIG. 8.

As shown in a region R1 of FIG. 8, the control circuit 2 sets the voltage VSL2 of the source line SL2 connected to the selected cell unit s-MU to 20 V, and sets the voltage VSGS of the gate of the source-side select transistor SSTr included in the selected cell unit s-MU to 12 V. That is, the voltage VSL2 of the source line SL2 connected to the selected cell unit s-MU becomes higher than the voltage VSGS of the gate of the source-side select transistor SSTr included in the selected cell unit s-MU by a voltage α (VSL2−α=VSGS). In this case, in the region R1 shown in FIG. 8, electron potential becomes as shown in FIG. 9. As a result, a GIDL current is generated, and holes generated by the GIDL current flow into the bodies of the memory transistors MTr1 to MTr7 included in the selected cell unit s-MU. On the other hand, electrons generated by the GIDL current flow from the selected cell unit s-MU to the source line SL2.

Figure 10A:
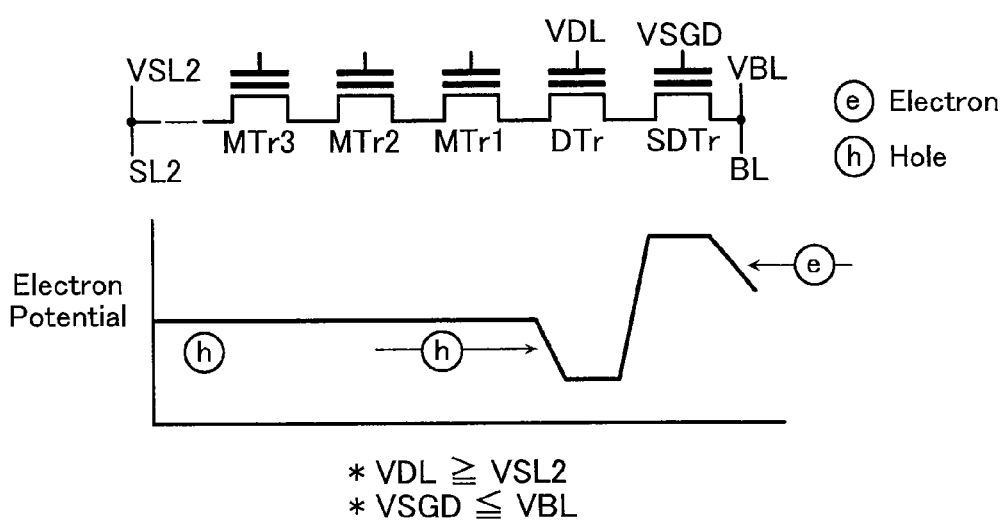
FIG. 10A is a diagram showing potential in a region R2 of FIG. 8.

Further, as shown in a region R2 of FIG. 8, the control circuit 2 sets the voltage VDL of the gate of the dummy transistor DTr included in the selected cell unit s-MU to 20 V. That is, the voltage VDL of the gate of the dummy transistor DTr included in the selected cell unit s-MU becomes equal to or higher than the voltage VSL2 of the source line SL2 connected to the selected cell unit s-MU (VDLVSL2). In this case, in the region R2 shown in FIG. 8, electron potential forms a potential barrier against holes as shown in FIG. 10A. Hence, migration of holes from the selected cell unit s-MU to the bit line BL is suppressed.

Further, as shown in the region R2 of FIG. 8, the control circuit 2 sets the voltage VSGD of the gate of the drain-side select transistor SDTr included in the selected cell unit s-MU to 8 V, and sets the voltage VBL of the bit line BL connected to the selected cell unit s-MU to 8 V. That is, the voltage VSGD of the gate of the drain-side select transistor SDTr included in the selected cell unit s-MU becomes equal to or lower than the voltage VBL of the bit line BL connected to the selected cell unit s-MU (VSGDVBL). In this case, in the region R2 shown in FIG. 8, electron potential forms a potential barrier against electrons as shown in FIG. 10A. Hence, migration of electrons from the bit line BL to the selected cell unit s-MU is suppressed.

Figure 10B:
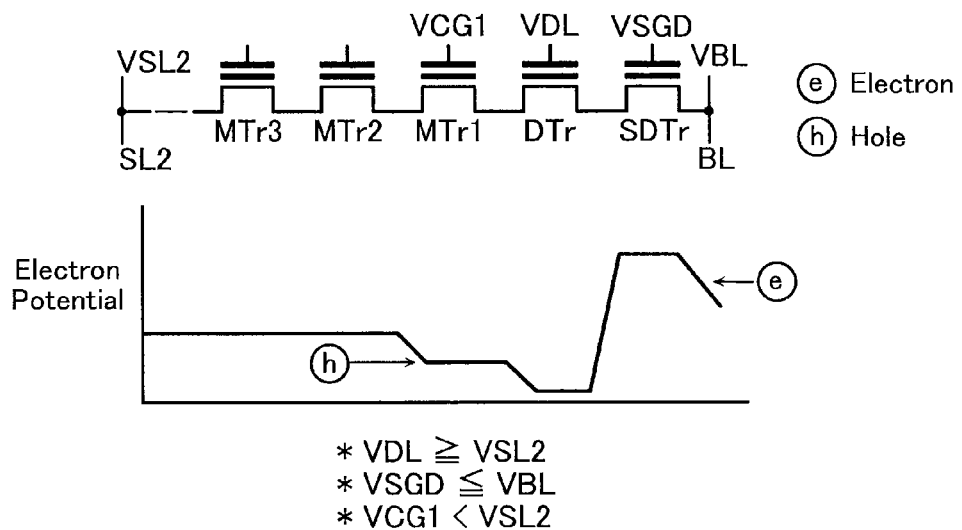
FIG. 10B is a diagram showing potential in the region R2 of FIG. 8.

The above-described control on the regions R1 and R2 of FIG. 8 causes the voltage of the bodies of the memory transistors MTr1 to MTr7 included in the selected cell unit s-MU to be raised to 20 V. Here, when not executing an erasing operation on the memory transistor MTr1 included in the selected cell unit s-MU, the control circuit 2 may set the voltage of the gate of the memory transistor MTr1 included in the selected cell unit s-MU to 15 V. That is, the voltage VCG1 of the gate of the memory transistor MTr1 included in the selected cell unit s-MU may be set lower than the voltage VSL2 of the source line SL2 (VCG1<VSL2). In this case, in the region R2 shown in FIG. 8, electron potential becomes as shown in FIG. 10B.

Next, the above-described process of setting the voltage of the bodies of the memory transistors MTr1 to MTr7 included in the non-selected cell unit ns-MU to 0 V will be explained.

Figure 11:
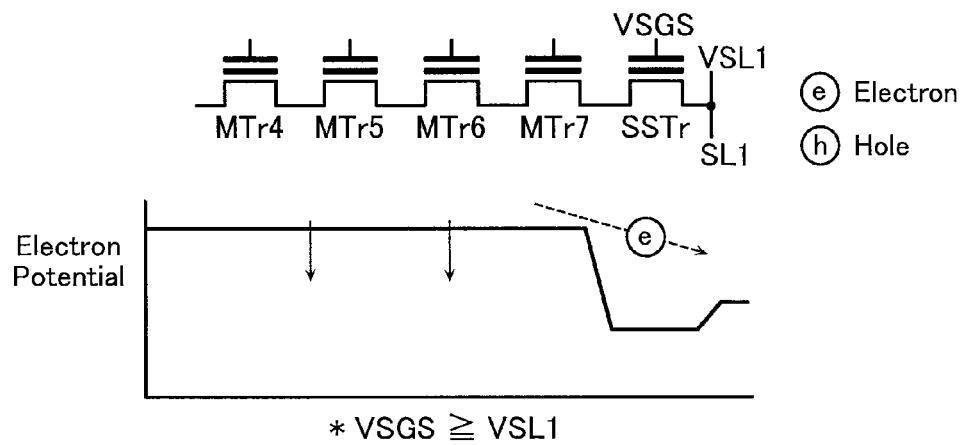
FIG. 11 is a diagram showing potential in a region R3 of FIG. 8.

As shown in a region R3 of FIG. 8, the control circuit 2 sets the voltage VSGS of the gate of the source-side select transistor SSTr included in the non-selected cell unit ns-MU to 8 V, and sets the voltage VSL1 of the source line SL1 connected to the non-selected cell unit ns-MU to 8 V. That is, the voltage VSGS of the gate of the source-side select transistor SSTr included in the non-selected cell unit ns-MU is set equal to or higher than the voltage VSL1 of the source line SL1 connected to the non-selected cell unit ns-MU (VSGS≥VSL1). In this case, in the region R3 shown in FIG. 8, electron potential becomes as shown in FIG. 11. As a result, no GIDL current is generated, and migration of electrons from the non-selected cell unit ns-MU to the source line SL1 is allowed.

Further, as shown in a region R4 of FIG. 8, the control circuit 2 sets the voltage VSGD of the gate of the drain-side select transistor SDTr included in the non-selected cell unit ns-MU to 8 V. That is, the voltage VSGD of the gate of the drain-side select transistor SDTr included in the non-selected cell unit ns-MU becomes equal to or higher than the voltage VBL of the bit line BL connected to the non-selected cell unit ns-MU (VSGD≥VBL). As a result, in the region R4 shown in FIG. 8, no GIDL current is generated, and migration of electrons from the non-selected cell unit ns-MU to the bit line BL is allowed.

The above-described control on the regions R3 and R4 of FIG. 8 causes the voltage of the bodies of the memory transistors MTr1 to MTr7 included in the non-selected cell unit ns-MU to be set to 0 V.

Figure 12:
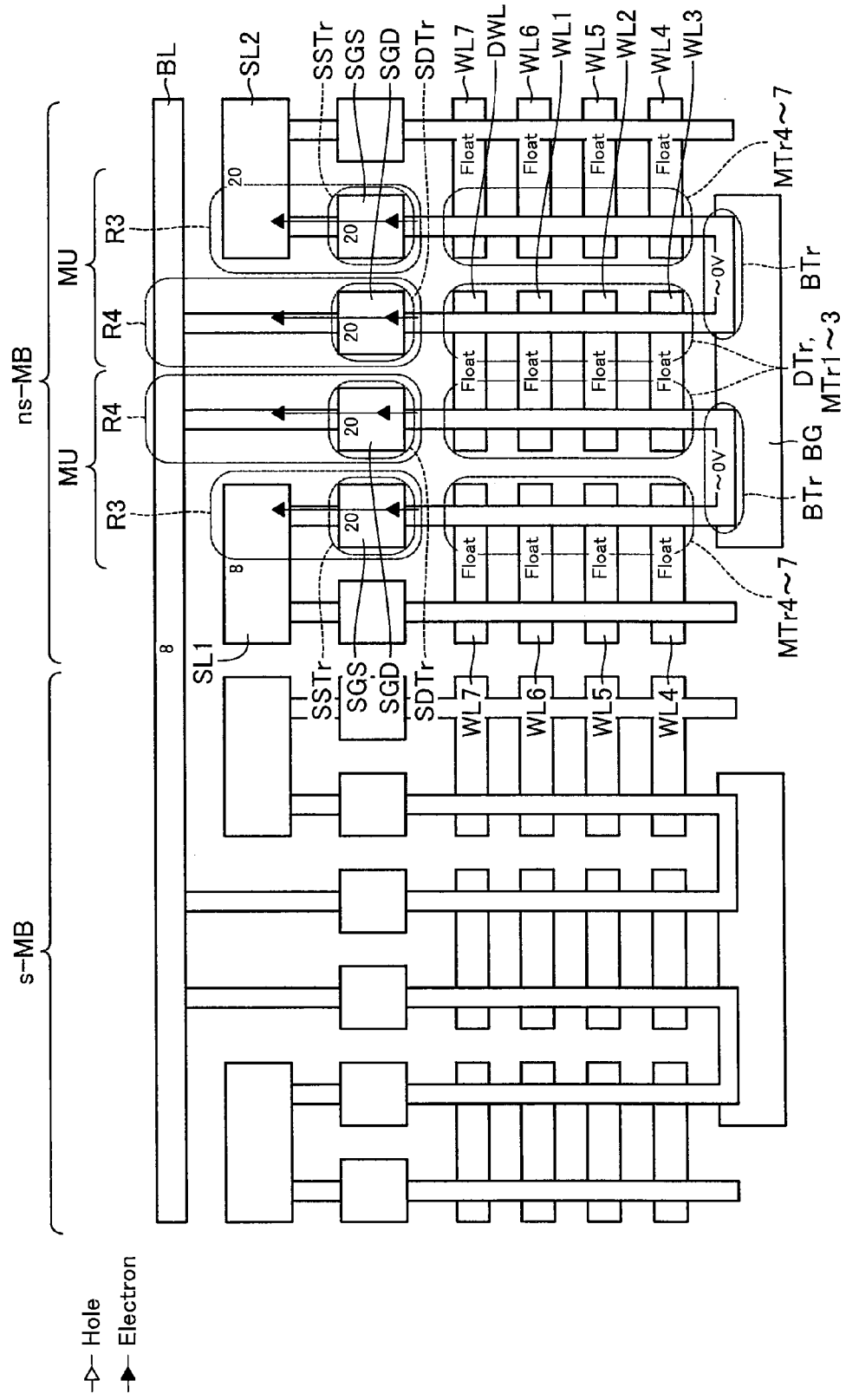
FIG. 12 is a diagram sowing one example of prohibiting an erasing operation on a non-selected memory block ns-MB according to the first embodiment.

Next, a control on the non-selected memory block MB (hereinafter referred to non-selected memory block ns-MB) will be explained with reference to FIG. 12. As shown in FIG. 12, the control circuit 2 brings the gates of the memory transistors MTr1 to MTr7 into a floating state. This prevents the charge accumulation layers of the memory transistors MTr1 to MTr7 from being applied with a high voltage regardless of the voltage of the bodies of the memory transistors MTr1 to MTr7. That is, an erasing operation on the non-selected memory block ns-MB can be prohibited.

Further, as shown in regions R3 of FIG. 12, the control circuit 2 sets the voltage VSGS of the gates of the source-side select transistors SSTr to 20 V, and sets the voltages VSL1 and VSL2 of the source lines SL1 and SL2 to 8 V and 20 V. That is, the voltage VSGS of the gates of the source-side select transistor SSTr becomes equal to or higher than the voltages VSL1 and VSL2 of the source lines S11 and SL2 (VSGS≥VSL1, VSL2). As a result, in the regions R3, migration of electrons from the cell units MU to the source lines SL1 and SL2 is allowed.

Further, as shown in regions R4 of FIG. 12, the control circuit 2 sets the voltage VSGD of the gates of the drain-side select transistors SDTr to 20 V, and sets the voltage VBL of the bit line BL to 8 V. That is, the voltage VSGD of the gates of the drain-side select transistors SDTr is set equal to or higher than the voltage VBL of the bit line BL (VSGD≥VBL). As a result, in the regions R4, migration of electrons from the cell units MU to the bit line BL is allowed.

The above-described control on the regions R3 and R4 of FIG. 12 causes the voltage of the bodies of the memory transistors MTr1 to MTr7 in the non-selected memory block ns-MB to be set to 0 V.

The erasing operation shown in FIG. 8 to FIG. 12 causes the charges accumulated in the charge accumulation layers of the memory transistors MTr1 to MTr7 to be discharged, but not the charges accumulated in the charge accumulation layers of the dummy transistors DTr. Accordingly, the threshold voltage of the dummy transistors DTr rises gradually, which might make conductivity control on the dummy transistors DTr difficult. Hence, as shown in FIG. 13, the first embodiment executes an operation of discharging the charges accumulated in the dummy transistors DTr in the selected memory block s-MB (hereinafter, referred to as a dummy erasing operation).

Figure 13:
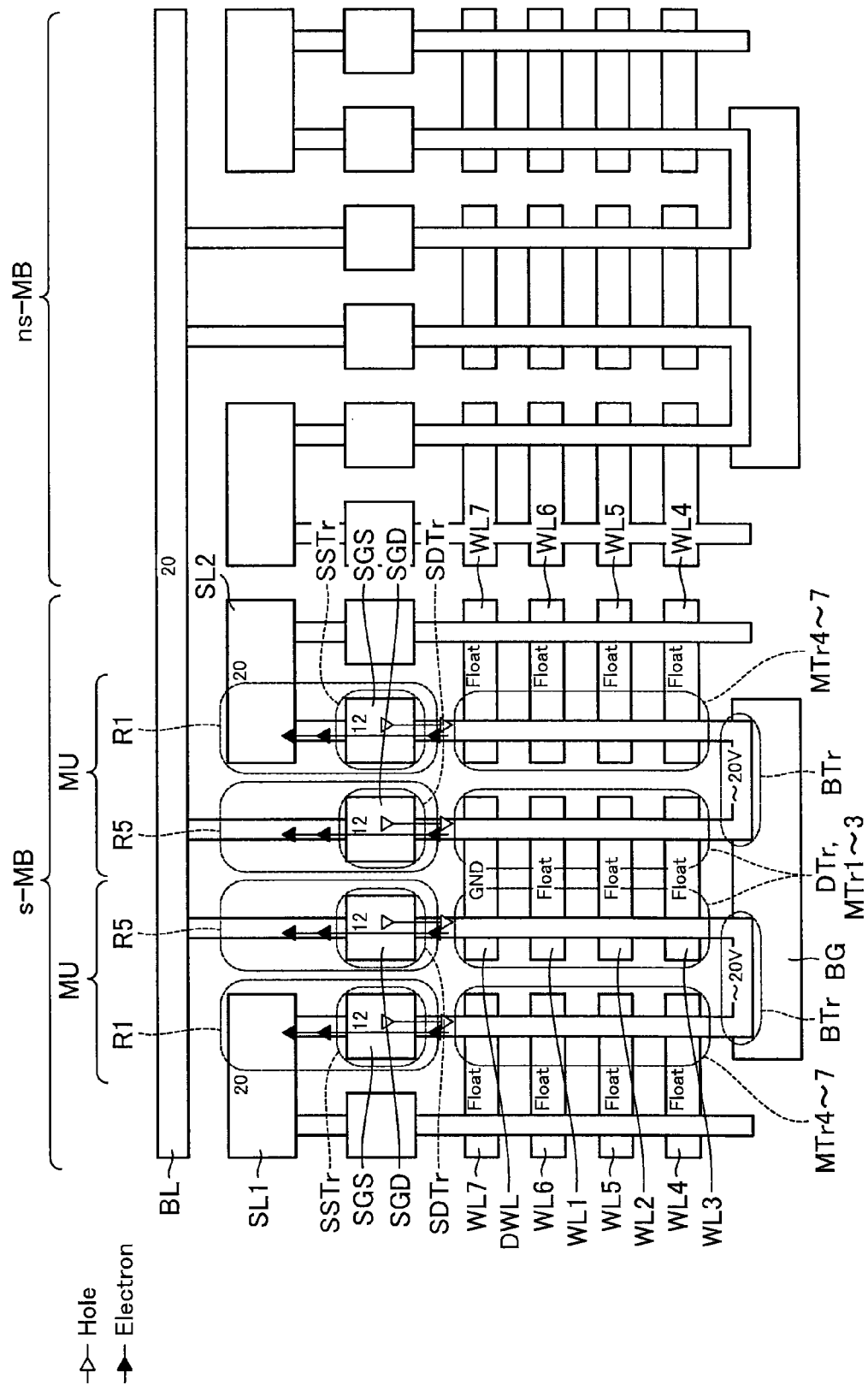
FIG. 13 is a diagram showing one example of discharging charges in the dummy transistors DTr in the selected memory block s-MB according to the first embodiment.

As shown in FIG. 13, in the dummy erasing operation, the control circuit 2 raises the voltage of the bodies of the dummy transistors DTr in the selected memory block s-MB to 20 V. Then, in the dummy erasing operation, the control circuit 2 sets the voltage of the gates of the dummy transistors DTr in the selected memory block s-MB to 0 V (GND), while bringing the gates of the memory transistors MTr1 to MTr7 into a floating state. As a result, a high voltage is applied to the charge accumulation layers of the dummy transistors DTr in the selected memory block s-MB, discharging the charges accumulated in the dummy transistors DTr. That is, the threshold voltage of the dummy transistors DTr is lowered, allowing execution of conductivity control on the dummy transistors DTr with no problem.

Next, the above-described process of raising the voltage of the bodies of the dummy transistors DTr in the selected memory block s-MB to 20 V will be explained.

As shown in regions R1 of FIG. 13, the control circuit 2 sets the voltages VSL1 and VSL2 of the source lines SL1 and SL2 in the selected memory block s-MB to 20 V, and sets the voltage VSGS of the gates of the source-side select transistors SSTr to 12 V. That is, in the selected memory block s-MB, the voltages VSL1 and VSL2 of the source lines SL1 and SL2 become higher than the voltage VSGS of the gates of the source-side select transistors SSTr by a voltage α (VSL1, VSL2−α=VSGS). As a result, a GIDL current is generated in the regions R1 and R5.

Further, as shown in the regions R5 of FIG. 13, the control circuit 2 sets the voltage VBL of the bit line BL in the selected memory block s-MB to 20 V, and sets the voltage VSGD of the gates of the drain-side select transistors SDTr to 12 V. That is, in the selected memory block s-MB, the voltage VBL of the bit line BL becomes higher than the voltage VSGD of the gates of the drain-side select transistors SDTr by a voltage a (VBL−α=VSGD). As a result, a GIDL current is generated in the regions R5.

The above-described control on the regions R1 and R5 of FIG. 13 causes the voltage of the bodies of the dummy transistors DTr in the selected memory block s-MB to be raised to 20 V.

Figure 14:
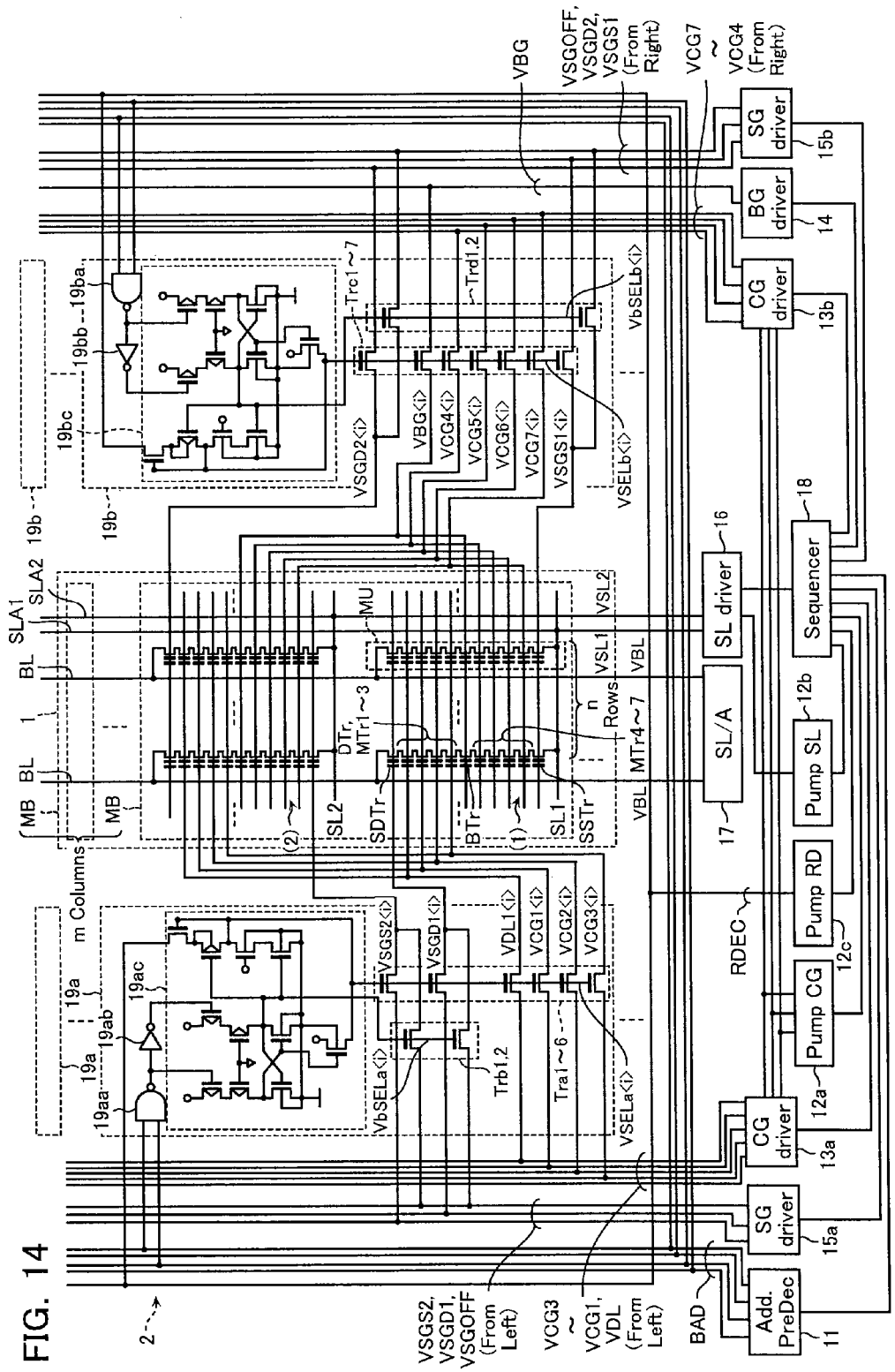
FIG. 14 is a circuit diagram showing the control circuit 2 according to the first embodiment.

Next, a specific configuration of the control circuit 2 capable of executing the erasing operation according to the above-described first embodiment will be explained with reference to FIG. 14. The control circuit 2 is configured to be capable of applying different voltages to the source lines SL1 and SL2 respectively. As shown in FIG. 14, the control circuit 2 includes an address decoder circuit 11, booster circuits 12a to 12c, word line driver circuits 13a and 13b, a back gate line driver circuit 14, select gate line driver circuits 15a and 15b, a source line driver circuit 16, a sense amplifier circuit 17, a sequencer 18, and row decoder circuits 19a and 19b.

As shown in FIG. 14, the address decoder circuit 11 outputs a signal BAD to the row decoder circuits 19a and 19b. The signal BAD is a signal for designating a memory block MB (a block address).

The booster circuits 12a to 12c generate a boosted voltage obtained by boosting a reference voltage. As shown in FIG. 14, the booster circuit 12a transfers the boosted voltage to the word line driver circuits 13a and 13b. The booster circuit 12b outputs the boosted voltage to the source line driver circuit 16. The booster circuit 12c outputs the boosted signal RDEC to the row decoder circuits 19a and 19b.

As shown in FIG. 14, the word line driver circuit 13a outputs signals VDL and VCG1 to VCG3. The word line driver circuit 13b outputs signals VCG4 to VCG7. The signal VDL is used for driving the dummy word line DWL of a selected memory block s-MB. The signals VCG1 to VCG7 are used for driving the word lines WL1 to WL7 of a selected memory block s-MB.

As shown in FIG. 14, the back gate line driver circuit 14 outputs a signal VBG. The signal VBG is used for driving the back gate line BG of a selected memory block s-MB.

As shown in FIG. 14, the select gate line driver circuit 15a outputs a signal VSGS2, a signal VSGD1, and a signal VSGOFF. The select gate line driver circuit 15b outputs a signal VSGS1, a signal VSGD2, and a signal VSGOFF. The signals VSGS1 and VSGS2 are used for driving the source-side select gate lines SGS in the first and second columns of a selected memory block s-MB respectively. The signals VSGD1 and VSGD2 are used for driving the drain-side select gate lines SGD in the first and second columns of a selected memory block s-MB respectively. The signals VSGOFF are used for driving the source-side select gate lines SGS and the drain-side select gate lines SGD of a non-selected memory block ns-MB.

The signal VSGS2, the signal VSGD1, and the signal VSGOFF described above are input to various lines from the select gate line driver circuit 15a through the row decoder circuit 19a. The signal VSGOFF, the signal VSGD2, and the signal VSGS1 are input to various lines from the select gate line driver circuit 15b through the row decoder circuit 19b.

As shown in FIG. 14, the source line driver circuit 16 outputs signals VSL1 and VSL2. The signals VSL1 and VSL2 are used for driving the source lines SL1 and SL2 through the common source lines SLA1 and SLA2 respectively.

As shown in FIG. 14, the sense amplifier circuit 17 charges a bit line BL up to a certain voltage by outputting a signal VBL, and then determines the data retained by the memory transistors MTr1 to MTr7 based on a change of the voltage of the bit line BL.

As shown in FIG. 14, the sequencer 18 controls the above-described circuits 11 to 17 by supplying control signals to them.

As shown in FIG. 14, one row decoder circuit 19a and one row decoder circuit 19b are provided for one memory block MB. The row decoder circuit 19a inputs signals VCG1<i> to VCG3<i> to the gates of the memory transistors MTr1 to MTr3 based on the signal BAD and the signals VCG1 to VCG3. The row decoder circuit 19a inputs a signal VDL<i> to the gate of the dummy transistor DTr based on the signal BAD and the signal VDL. The row decoder circuit 19a inputs a signal VSGS2<i> selectively to the gates of the source-side select transistors SSTr of the cell units MU in the second column, based on the signal BAD, the signal VSGS2, and the signal VSGOFF. The row decoder circuit 19a inputs a signal VSGD1<i> selectively to the gates of the drain-side select transistors SDTr of the cell units MU in the first column, based on the signal BAD, the signal VSGD1, and the signal VSGOFF.

The row decoder circuit 19a includes a NAND circuit 19aa, a NOT circuit 19ab, a voltage converter circuit 19ac, first transfer transistors Tra1 to Tra6, and second transfer transistors Trb1 and Trb2. The voltage converter circuit 19ac generates a signal VSELa<i> based on the signal BAD received through the NAND circuit 19aa and the NOT circuit 19ab and the signal RDEC, and outputs it to the gates of the first transfer transistors Tra1 to Tra6. The voltage converter circuit 19ac also generates a signal VbSELa<i> based on the signal BAD and the signal RDEC, and outputs it to the gates of the second transfer transistors Trb1 and Trb2.

The first transfer transistor Tra1 is connected between the word line driver circuit 13a and the dummy word line DWL. The first transfer transistors Tra2 to Tra4 are connected between the word line driver circuit 13a and the word lines WL1 to WL3 respectively. The first transfer transistor Tra1 outputs a signal VDL<i> to the dummy word line DWL based on the signal VDL and the signal VSELa<i>. The first transfer transistors Tra2 to Tra4 output signals VCG1<i> to VCG3<i> to the word lines WL1 to WL3 respectively based on the signals VCG1 to VCG3 and the signal VSELa<i>. The first transfer transistor Tra5 is connected between the select gate line driver circuit 15a and the source-side select gate line SGS of the cell units MU in the second column. The first transfer transistor Tra5 outputs a signal VSGS2<i> to the source-side select gate line SGS of the cell units MU in the second column, based on the signal VSGS2 and the signal VSELa<i>. The first transfer transistor Tra6 is connected between the select gate line driver circuit 15a and the drain-side select gate line SGD of the cell units MU in the first column. The first transfer transistor Tra6 outputs a signal VSGD1<i> to the drain-side select gate line SGD of the cell units MU in the first column based on the signal VSGD1 and the signal VSELa<i>.

The second transfer transistor Trb1 is connected between the select gate line driver circuit 15a and the source-side select gate line SGS in the second column. The second transfer transistor Trb1 outputs a signal VSGS2<i> to the source-side select gate line SGS of the cell units MU in the second column based on the signal VSGOFF and the signal VbSELa<i>. The second transfer transistor Trb2 is connected between the select gate line driver circuit 15a and the drain-side select gate line SGD of the cell units MU in the first column. The second transfer transistor Trb2 outputs a signal VSGD1<i> to the drain-side select gate line SGD of the cell units MU in the first column based on the signal VSGOFF and the signal VbSELa≤i>.

The row decoder circuit 19b inputs signals VCG4<i> to VCG7<i> to the gates of the memory transistors MTr4 to MTr7 based on the signal BAD and the signals VCG4 to VCG7. The row decoder circuit 19b inputs a signal VSGS1<i> selectively to the gates of the source-side select transistors SSTr of the cell units MU in the first column based on the signal BAD, the signal VSGS1, and the signal VSGOFF. The row decoder circuit 19b inputs a signal VSGD2<i> selectively to the gates of the drain-side select transistors SDTr of the cell units MU in the second column based on the signal BAD, the signal VSGD2, and the signal VSGOFF.

The row decoder circuit 19b includes a NAND circuit 19ba, a NOT circuit 19bb, a voltage converter circuit 19bc, first transfer transistors Trc1 to Trc7, and second transfer transistors Trd1 and Trd2. The voltage converter circuit 19bc generates a signal VSELb<i> based on the signal BAD received through the NAND circuit 19ba and the NOT circuit 19bb and the signal RDEC, and outputs it to the gates of the first transfer transistors Trc1 to Rrc7. The voltage converter circuit 19bc also generates a signal VbSELb<i> based on the signal BAD and the signal RDEC, and outputs it to the gates of the second transfer transistors Trd1 and Trd2.

The first transfer transistors Trc1 to Trc4 are connected between the word line driver circuit 13b and the word lines WL4 to WL7 respectively. The first transfer transistors Trc1 to Trc4 output signals VCG4<i> to VCG7<i> to the word lines WL4 to WL7 based on the signals VCG4 to VCG7 and the signal VSELb<i>. The first transfer transistor Trc5 is connected between the back gate line driver circuit 14 and the back gate line BG. The first transfer transistor Trc5 outputs a signal VBG<i> to the back gate line BG based on the signal VBG and the signal VSELb<i>. The first transfer transistor Trc6 is connected between the select gate line driver circuit 15b and the source-side select gate line SGS of the cell units MU in the first column. The first transfer transistor Trc6 outputs a signal VSGS1<i> to the source-side select gate line SGS of the cell units MU in the first column based on the signal VSGS1 and the signal VSELb<i>. The first transfer transistor Trc7 is connected between the select gate line driver circuit 15b and the drain-side select gate line SGD of the cell units MU in the second column. The first transfer transistor Trc7 outputs a signal VSGD2<i> to the drain-side select gate line SGD of the cell units MU in the second column based on the signal VSGD2 and the signal VSELb<i>.

The second transfer transistor Trd1 is connected between the select gate line driver circuit 15b and the source-side select gate line SGS of the cell units MU in the first column. The second transfer transistor Trd1 outputs a signal VSGS1<i> to the source-side select gate line SGS of the cell units MU in the first column based on the signal VSGOFF and the signal VbSELb<i>. The second transfer transistor Trd2 is connected between the select gate line driver circuit 15b and the drain-side select gate line SGD of the cell units MU in the second column. The second transfer transistor Trd2 outputs a signal VSGD2<i> to the drain-side select gate line SGD of the cell units MU in the second column based on the signal VSGOFF and the signal VbSELb<i>. The erasing operation according to the first embodiment can be executed by means of the circuit described above shown in FIG. 14.

Second Embodiment

Figure 15:
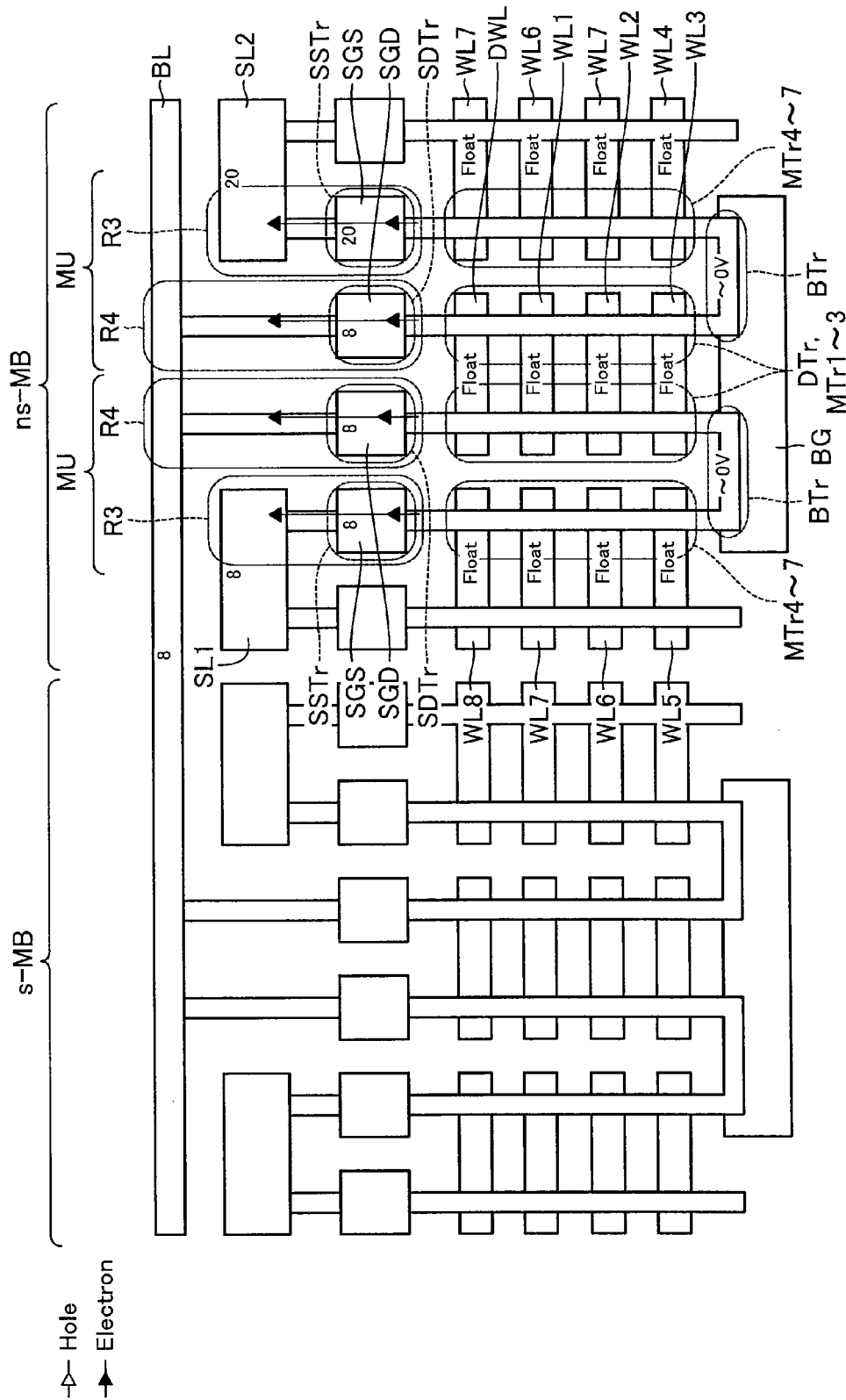
FIG. 15 is a diagram showing one example of prohibiting an erasing operation on a non-selected memory block ns-MB according to a second embodiment.

Next, an erasing operation of a nonvolatile semiconductor memory device according to a second embodiment will be explained with reference to FIG. 15. The second embodiment is different from the first embodiment in the control on a non-selected memory block ns-MB. Any components of the second embodiment that are the same as those in the first embodiment will be denoted by the same reference numerals and explanation thereof will not be provided.

According to the first embodiment, in a non-selected memory block ns-MB, the control circuit 2 sets the voltage VSGD of the gates of the drain-side select transistors SDTr and the voltage VSGS of the gate of the source-side select transistor SSTr connected to the source line SL1 to 20 V (see FIG. 12). As compared with this, according to the second embodiment, in a non-selected memory block ns-MB, the control circuit 2 sets the voltage VSGD of the gates of the drain-side select transistors SDTr and the voltage VSGS of the gate of the source-side select transistor SSTr connected to the source line SL1 to 8 V as shown in FIG. 15. The second embodiment is different from the first embodiment in this point. This allows migration of electrons from the cell units MU to the source lines SL1 and SL2 in the regions R3 of FIG. 15, like in the first embodiment. This also allows migration of electrons from the cell units MU to the bit line BL in the regions R4 of FIG. 15. The second embodiment can save power consumption as compared with the first embodiment because the second embodiment reduces the voltages to be applied to the gates to 8 V.

Figure 16:
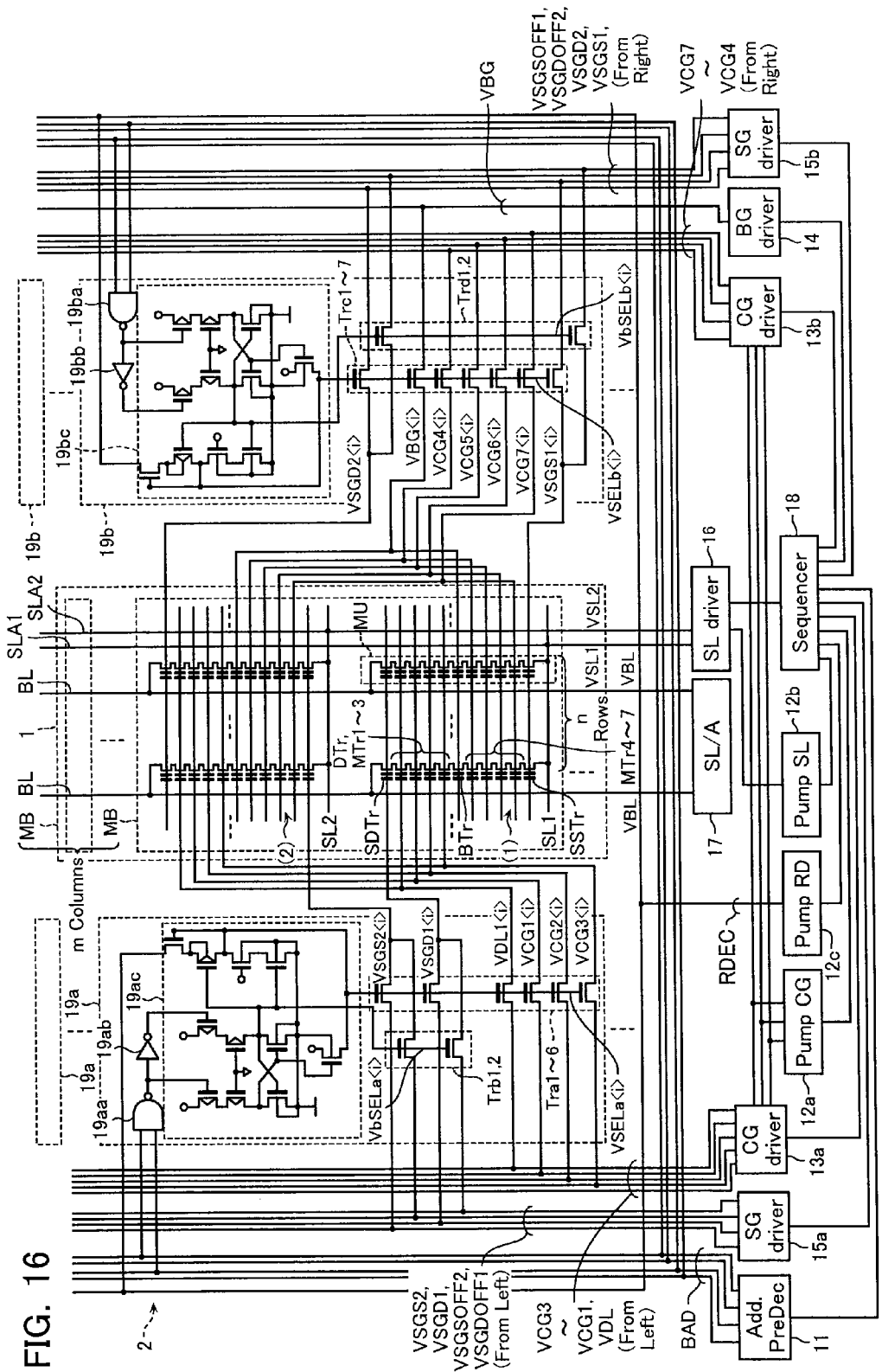
FIG. 16 is a circuit diagram showing a control circuit 2 according to the second embodiment.

Next, a specific configuration of the control circuit 2 capable of executing the above-described erasing operation according to the second embodiment will be explained with reference to FIG. 16. Being different from the first embodiment, the control circuit 2 is configured to be capable of applying different voltages to the source-side select gate lines SGS located in the first column and the second column of the non-selected memory block ns-MB respectively. Hence, in the control circuit 2 according to the second embodiment, output signals of the select gate line driver circuits 15a and 15b are different from the first embodiment, as shown in FIG. 16.

The select gate line driver circuit 15a outputs signals VSGDOFF1 and VSGSOFF2 instead of the signal VSGOFF of the first embodiment. The select gate line driver circuit 15b outputs signals VSGDOFF2 and VSGSOFF1 instead of the signal VSGOFF.

The signals VSGSOFF1 and VSGSOFF2 are used for driving the source-side select gate lines SGS located in the first and second columns of a non-selected memory block ns-MB respectively. The signal VSGSOFF1 is supplied to one end of a second transfer transistor Trd1. The signal VSGSOFF2 is supplied to one end of a second transfer transistor Trb1.

The signals VSGDOFF1 and VSGDOFF2 are used for driving the drain-side select gate lines SGD located in the first and second columns of a non-selected memory block ns-MB respectively. The signal VSGDOFF1 is supplied to one end of a second transfer transistor Trd2. The signal VSGDOFF2 is supplied to one end of a second transfer transistor Trd2. The erasing operation according to the second embodiment can be executed by means of the circuit shown in FIG. 16.

Third Embodiment

Next, an erasing operation of a nonvolatile semiconductor memory device according to a third embodiment will be explained with reference to FIG. 17. The third embodiment is different from the first embodiment in a control on a non-selected memory block ns-MB. Any components of the third embodiment that are the same as the first and second embodiments will be denoted by the same reference numerals and explanation thereof will not be provided.

Figure 17:
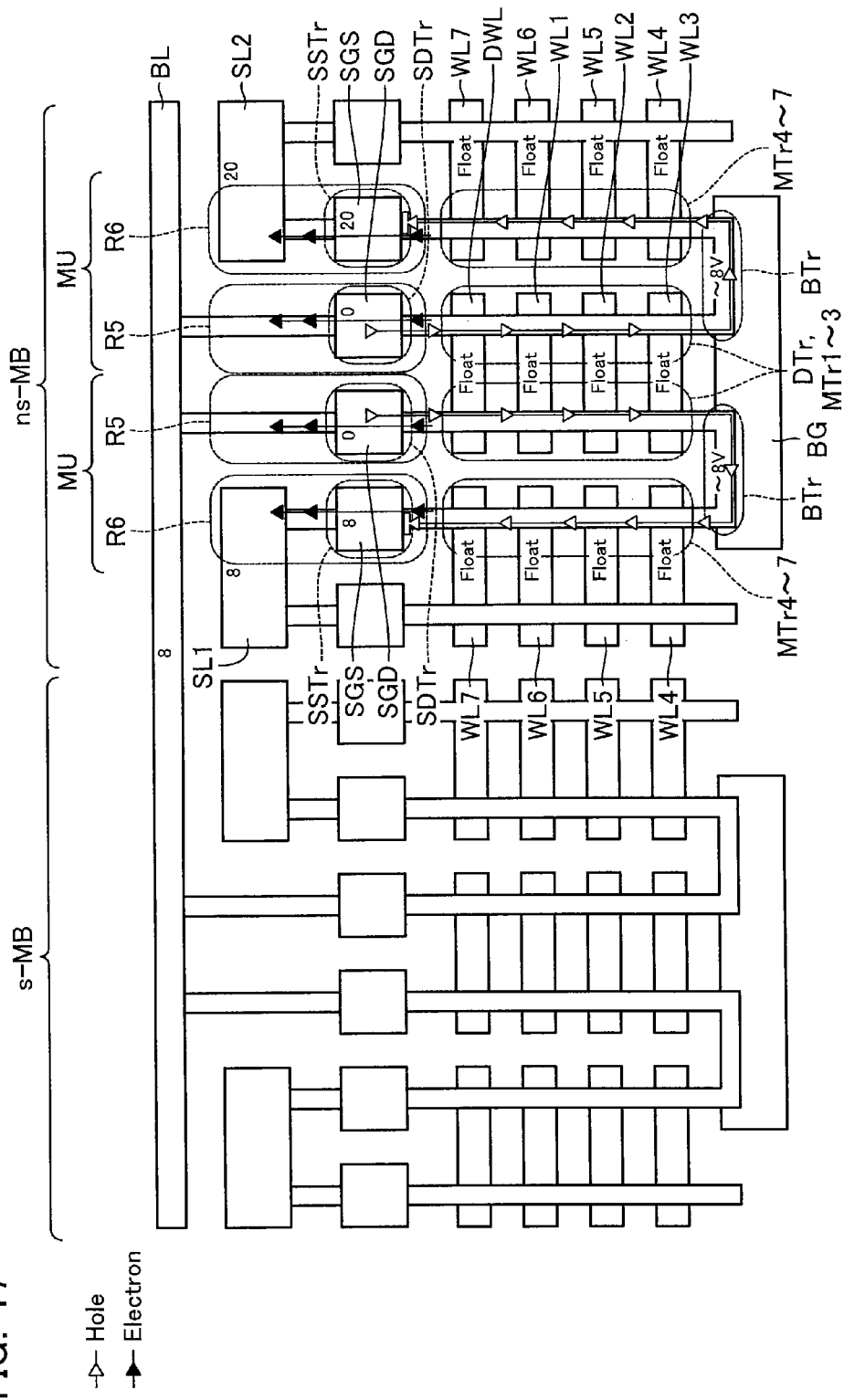
FIG. 17 is a diagram showing one example of prohibiting an erasing operation on a non-selected memory block ns-MB according to a third embodiment.

According to the third embodiment, the control circuit 2 generates a GIDL current in a non-selected memory block ns-MB as shown in FIG. 17. The third embodiment is different from the first embodiment in this point. Specifically, as shown in regions R5 of FIG. 17, in a non-selected memory block ns-MB, the control circuit 2 sets the voltage VBL of the bit line BL to 8 V and the voltage VSGD of the gates of the drain-side select transistors SDTr to 0 V. That is, the voltage VBL of the bit line BL becomes higher than the voltage VSGD of the gates of the drain-side select transistors SDTr by a voltage α (VBL−α=VSGD). As a result, a GIDL current is generated in the regions R5 of FIG. 17.

Figure 18:
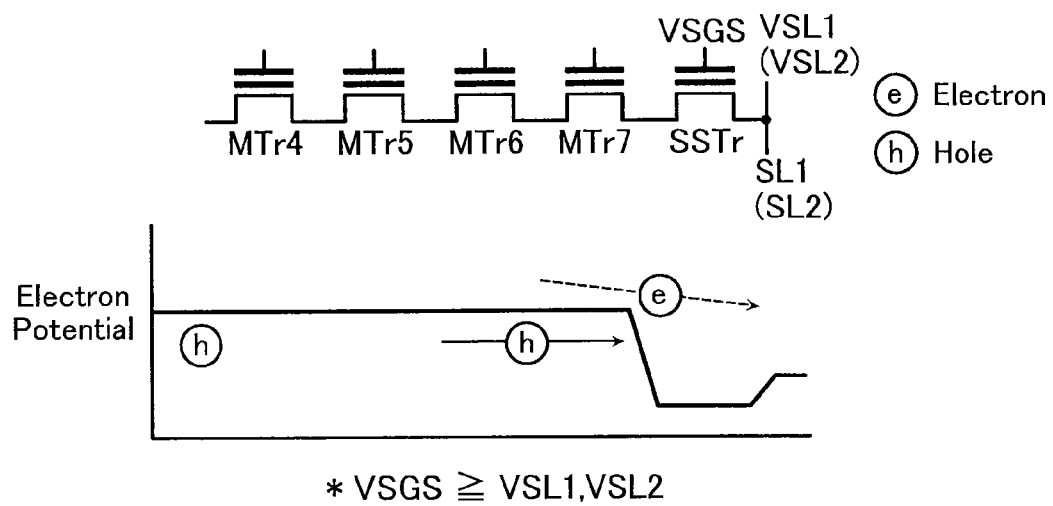
FIG. 18 is a diagram showing potential in regions R6 of FIG. 17.

Further, as shown in regions R6 of FIG. 17, the control circuit 2 sets the voltages VSL1 and VSL2 of the source lines SL1 and SL2 to 8 V and 20 V respectively. The control circuit 2 sets the voltage VSGS of the gate of the source-side select transistor SSTr near the source line SL1 to 8 V, and the voltage VSGS of the gate of the source-side select transistor SSTr near the source line SL2 to 20 V. That is, the voltages VSGS of the gates of the source-side select transistors SSTr become equal to or higher than the voltages VSL1 and VSL2 of the source lines SL1 and SL2 respectively (VSGS≥VSL1, VSL2). In this case, in the regions R6 shown in FIG. 17, electron potential becomes as shown in FIG. 18. Hence, in the regions R6 of FIG. 17, migration of electrons from the cell units MU to the source lines SL1 and SL2 is allowed. On the other hand, migration of holes from the cell units MU to the source lines SL1 and SL2 is suppressed.

The above-described control on the regions R5 and R6 of FIG. 17 causes the voltage of the bodies of the memory transistors MTr1 to MTr7 to be raised to 8 V. However, because the control circuit 2 has the word lines WL1 to WL7 set in a floating state, the charge accumulation layers of the memory transistors MTr1 to MTr7 of the non-selected memory block ns-MB are prevented from being applied with a high voltage. Hence, an erasing operation on the non-selected memory block ns-MB is prohibited.

The erasing operation according to the third embodiment can be executed by means of the control circuit 2 according to the second embodiment shown in FIG. 16.

Fourth Embodiment

Figure 19:
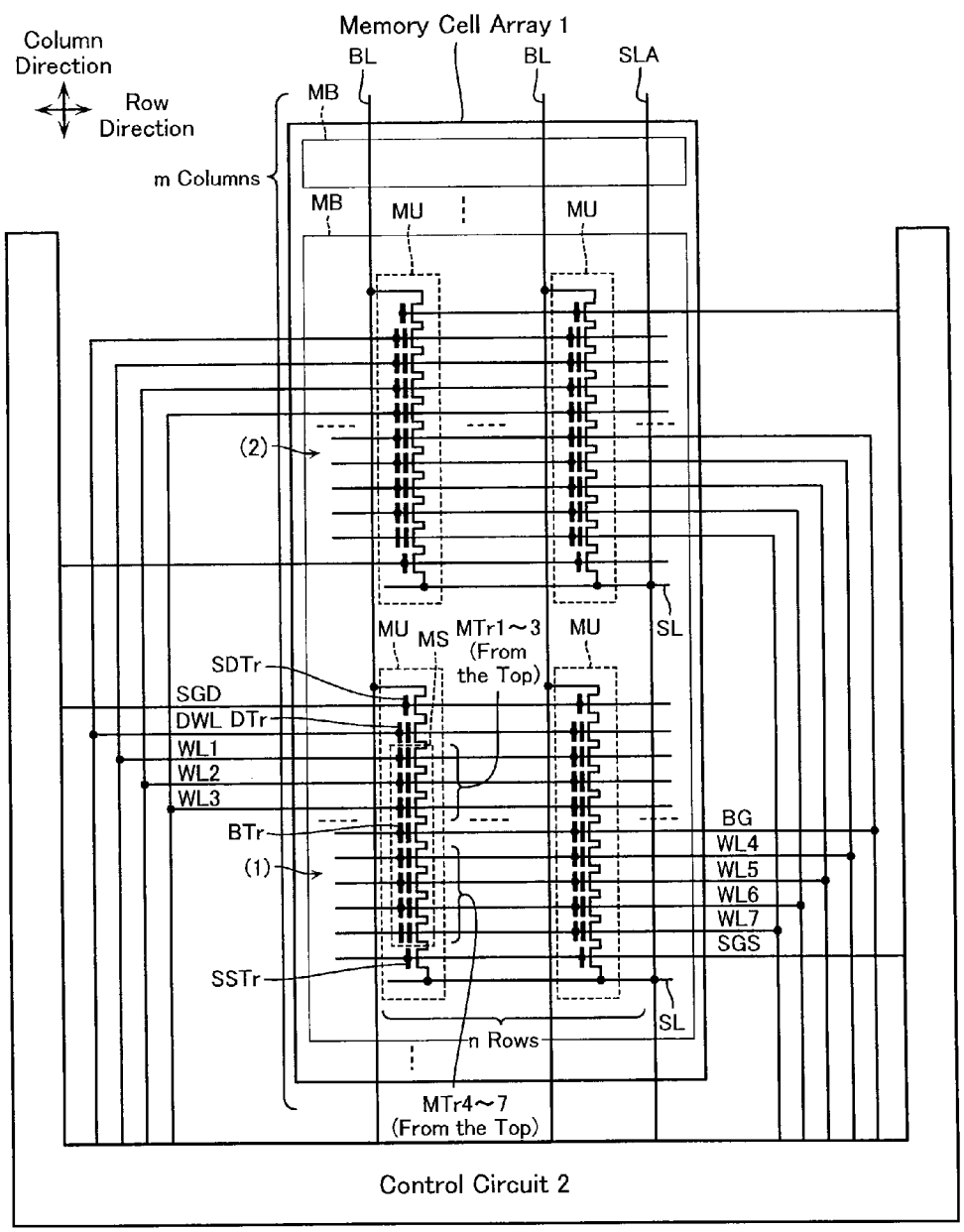
FIG. 19 is a diagram showing a memory cell array 1 and a control circuit 2 of a nonvolatile semiconductor memory device according to a fourth embodiment.

Next, a schematic configuration of a nonvolatile semiconductor memory device according to a fourth embodiment will be explained with reference to FIG. 19. As shown in FIG. 19, the fourth embodiment includes source lines SL and a common source line SLA instead of the source lines SL1 and SL2 and the common source lines SLA1 and SLA2 of the first embodiment. Each memory block MB includes two source lines SL. The two source lines SL are connected to one common source line SLA. The fourth embodiment is different from the first embodiment in this point. Any components of the fourth embodiment that are the same as the first to third embodiments will be denoted by the same reference numerals and explanation thereof will not be provided.

Figure 20:
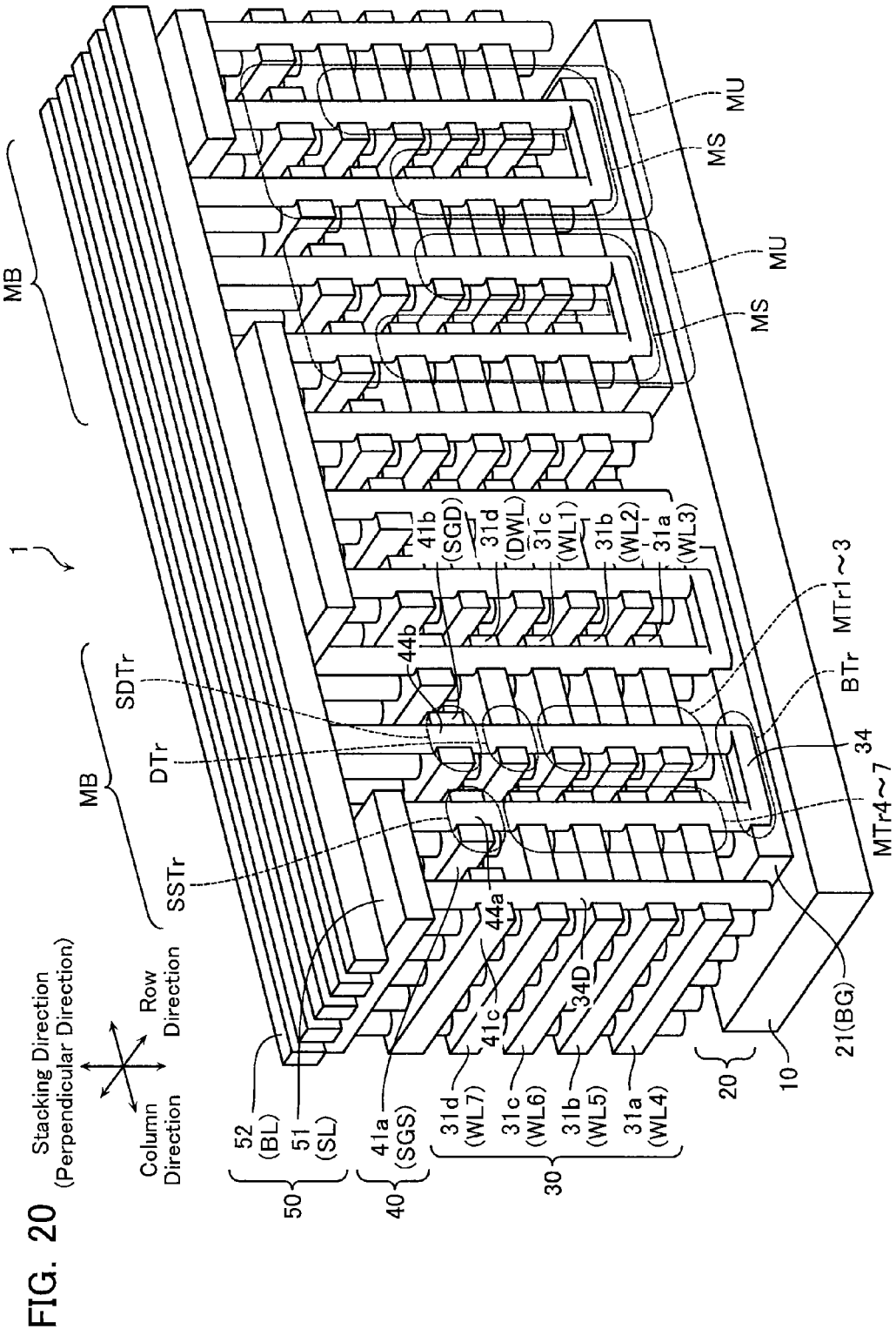
FIG. 20 is a perspective diagram showing a stacked configuration of the memory cell array 1 according to the fourth embodiment.
Figure 21:
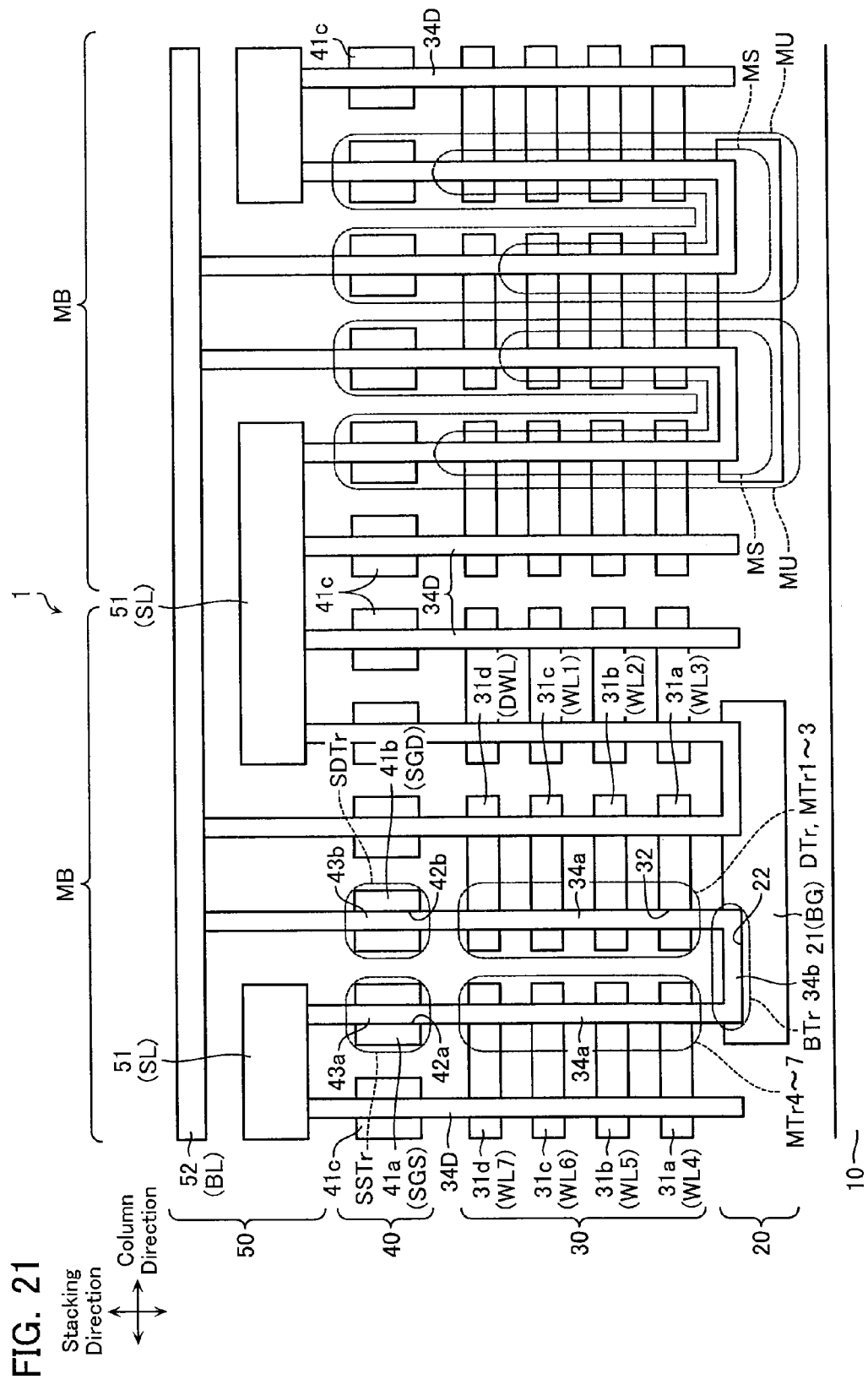
FIG. 21 is a cross-sectional diagram showing a stacked configuration of the memory cell array 1 according to the fourth embodiment.

A stacked configuration of a memory cell array 1 according to the fourth embodiment will be explained with reference to FIG. 20 to FIG. 22. As shown in FIG. 20 and FIG. 21, the memory cell array 1 according to the fourth embodiment includes source layers 51 instead of the source layers 51a and 51b of the first embodiment. The source layers 51 function as the source lines SL.

Figure 22:
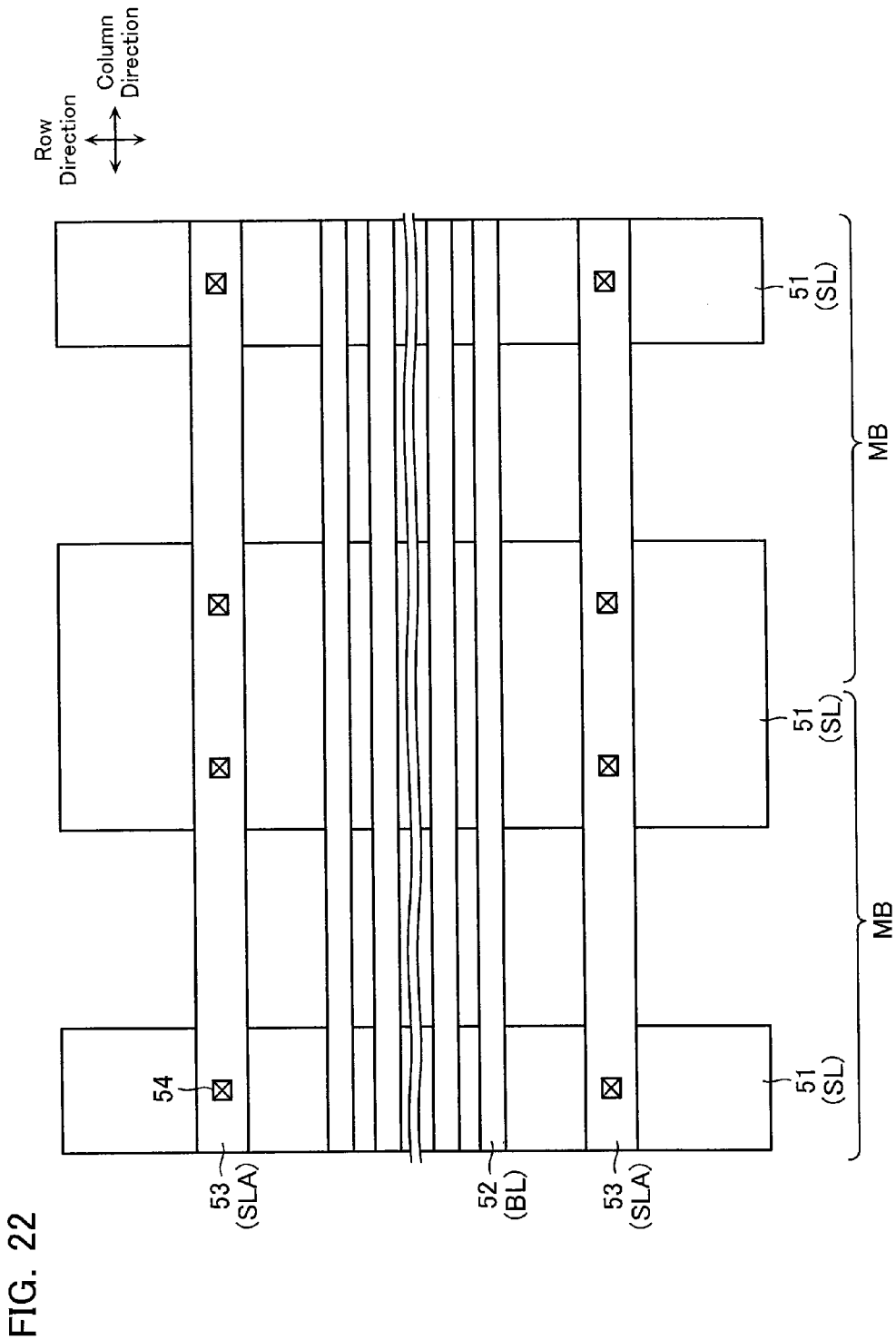
FIG. 22 is a top view showing source layers 51, bit layers 52, and common source layers 53.

As shown in FIG. 22, two source layers 51 are provided in one memory block MB like in the first embodiment. However, one of the source layers 51 is shared between a pair of adjoining memory blocks MB. The source layers 51 are connected to a common source layer 53 through plug layers 54. The common source layer 53 functions as the common source line SLA.

Figure 23:
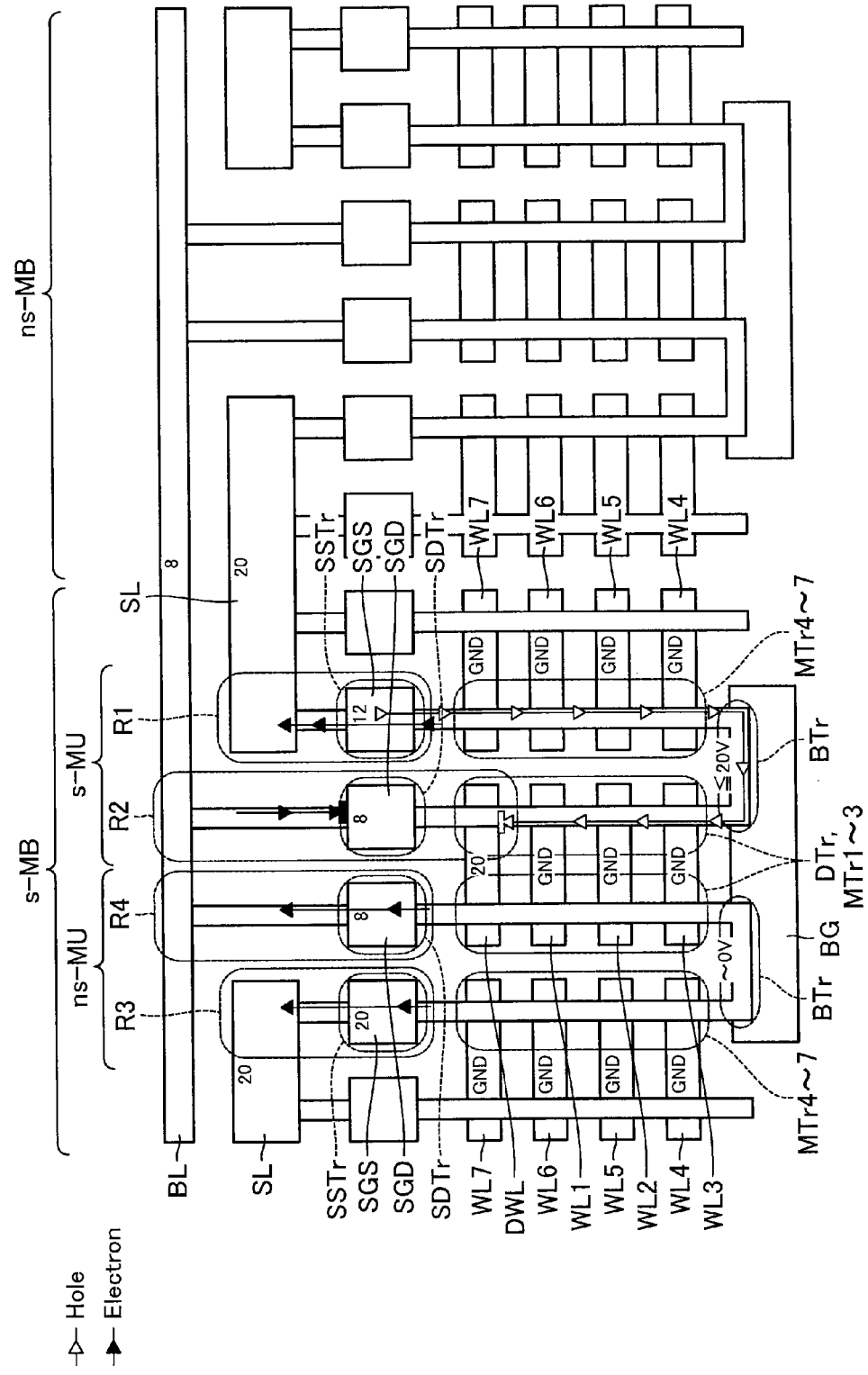
FIG. 23 is a diagram showing one example of executing an erasing operation on a selected cell unit s-MU in a selected memory block s-MB according to the fourth embodiment.

Next, a control for executing an erasing operation on a selected cell unit s-MU according to the fourth embodiment will be explained with reference to FIG. 23. As shown in FIG. 23, the control circuit 2 executes approximately the same control as the first embodiment on a selected memory block s-MB. However, the control circuit 2 sets the voltage VSL of the source lines SL to 20 V, and sets the voltage VSGS of the gate of source-side select transistor SSTr included in a non-selected cell unit ns-MU to 20 V. As a result, also in the fourth embodiment, regions R1 to R4 similar to those of the first embodiment are set in the selected memory block s-MB. That is, the fourth embodiment produces the same effect as the first embodiment in the selected memory block s-MB.

Figure 24:
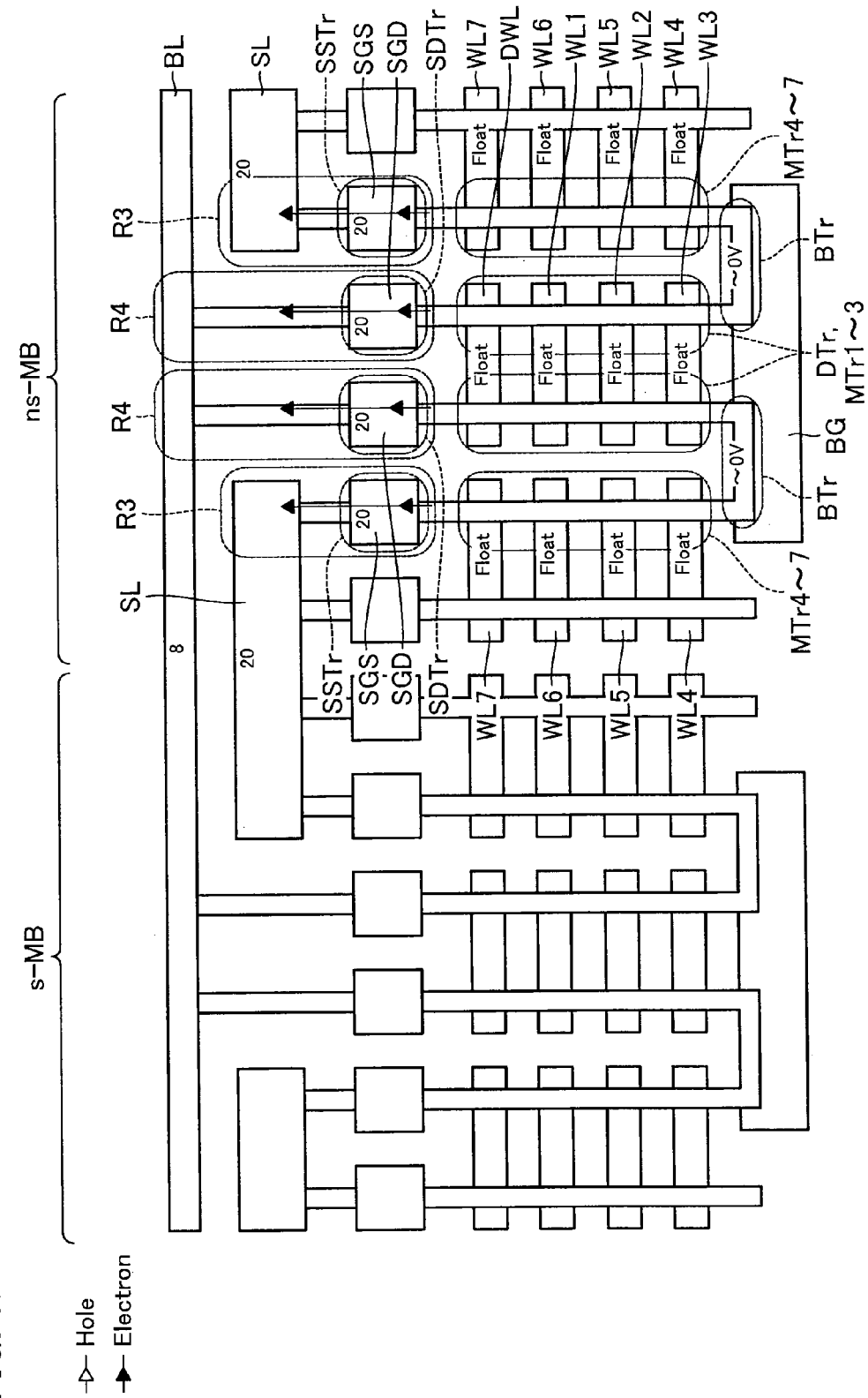
FIG. 24 is a diagram showing one example of prohibiting an erasing operation on a non-selected memory block ns-MB according to the fourth embodiment.

Next, a control for prohibiting an erasing operation on a non-selected memory block ns-MB according to the fourth embodiment will be explained with reference to FIG. 24. As shown in FIG. 24, the control circuit 2 executes approximately the same control as the first embodiment on a non-selected memory block ns-MB. However, the control circuit 2 sets the voltage VSL of the source lines SL to 20 V. As a result, also in the fourth embodiment, regions R3 and R4 similar to those of the first embodiment are set in the non-selected memory block ns-MB. That is, the fourth embodiment produces the same effect as the first embodiment in the non-selected memory block ns-MB.

Figure 25:
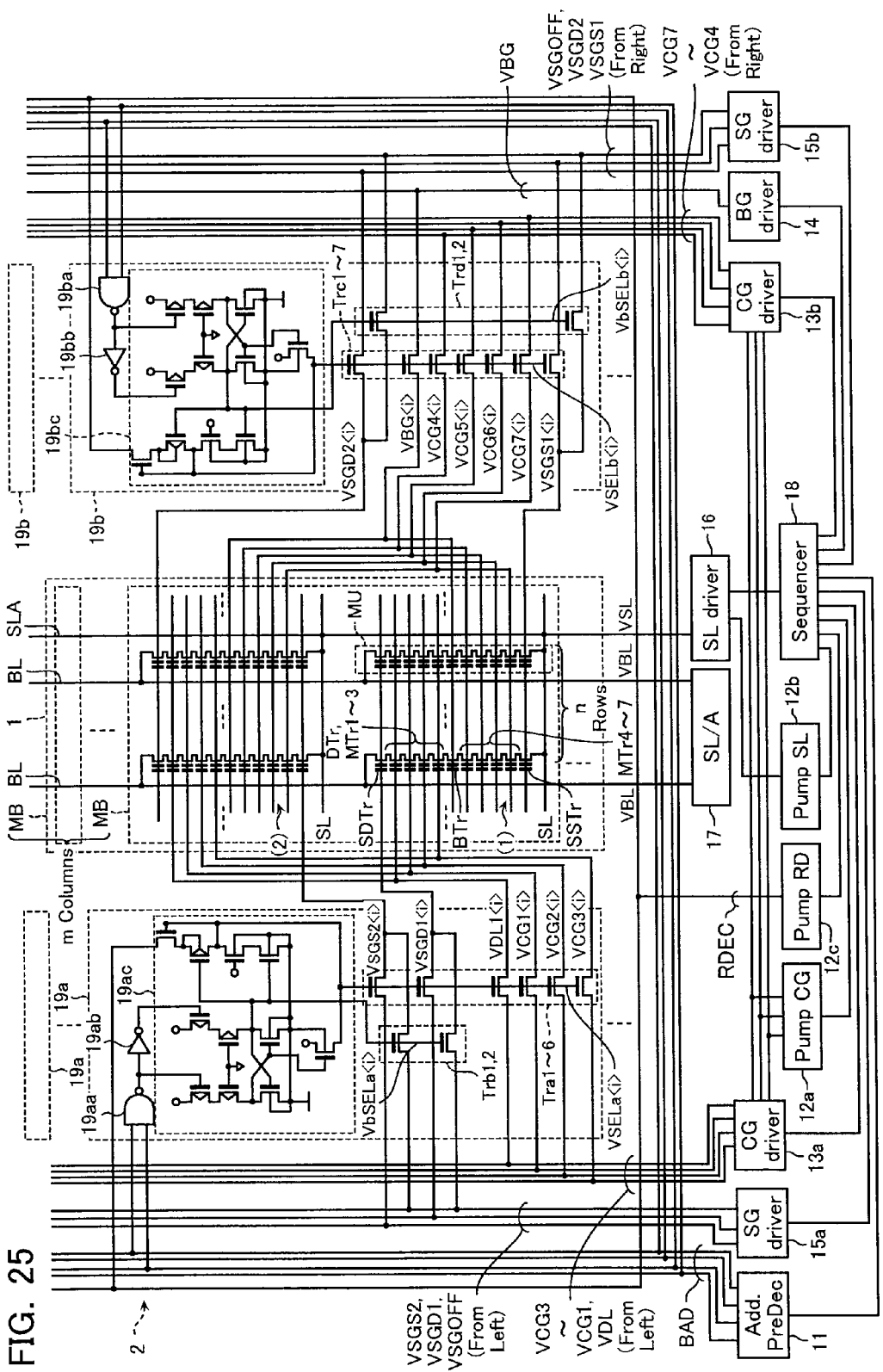
FIG. 25 is a circuit diagram showing the control circuit according to the fourth embodiment.

Next, a specific configuration of the control circuit 2 capable of executing the above-described erasing operation according to the fourth embodiment will be explained with reference to FIG. 25. The control circuit 2 according to the fourth embodiment needs only to be configured to supply a single voltage to the source lines SL, unlike in the first embodiment where different voltages are supplied to the source lines SL1 and SL2. That is, in the control circuit 2 according to the fourth embodiment, the output signal of the source line driver circuit 16 is different from the first embodiment, as shown in FIG. 25.

The source line driver circuit 16 outputs a signal VSL instead of the signals VSL1 and VSL2. The signal VSL is used for driving the source lines SL through the common source line SLA. The erasing operation according to the fourth embodiment can be executed by means of the circuit shown in FIG. 25. Hence, the fourth embodiment can save the occupation area as compared with the first embodiment, as the number of source lines SL is reduced from the first embodiment.

Fifth Embodiment

Next, an erasing operation of a nonvolatile semiconductor memory device according to a fifth embodiment will be explained with reference to FIG. 26. The configuration of the memory cell array 1 according to the fifth embodiment is the same as the fourth embodiment. On the other hand, control on a non-selected memory block ns-MB according to the fifth embodiment is different from the fourth embodiment. Any components of the fifth embodiment that are the same as the first to fourth embodiment will be denoted by the same reference numerals and explanation thereof will not be provided.

Figure 26:
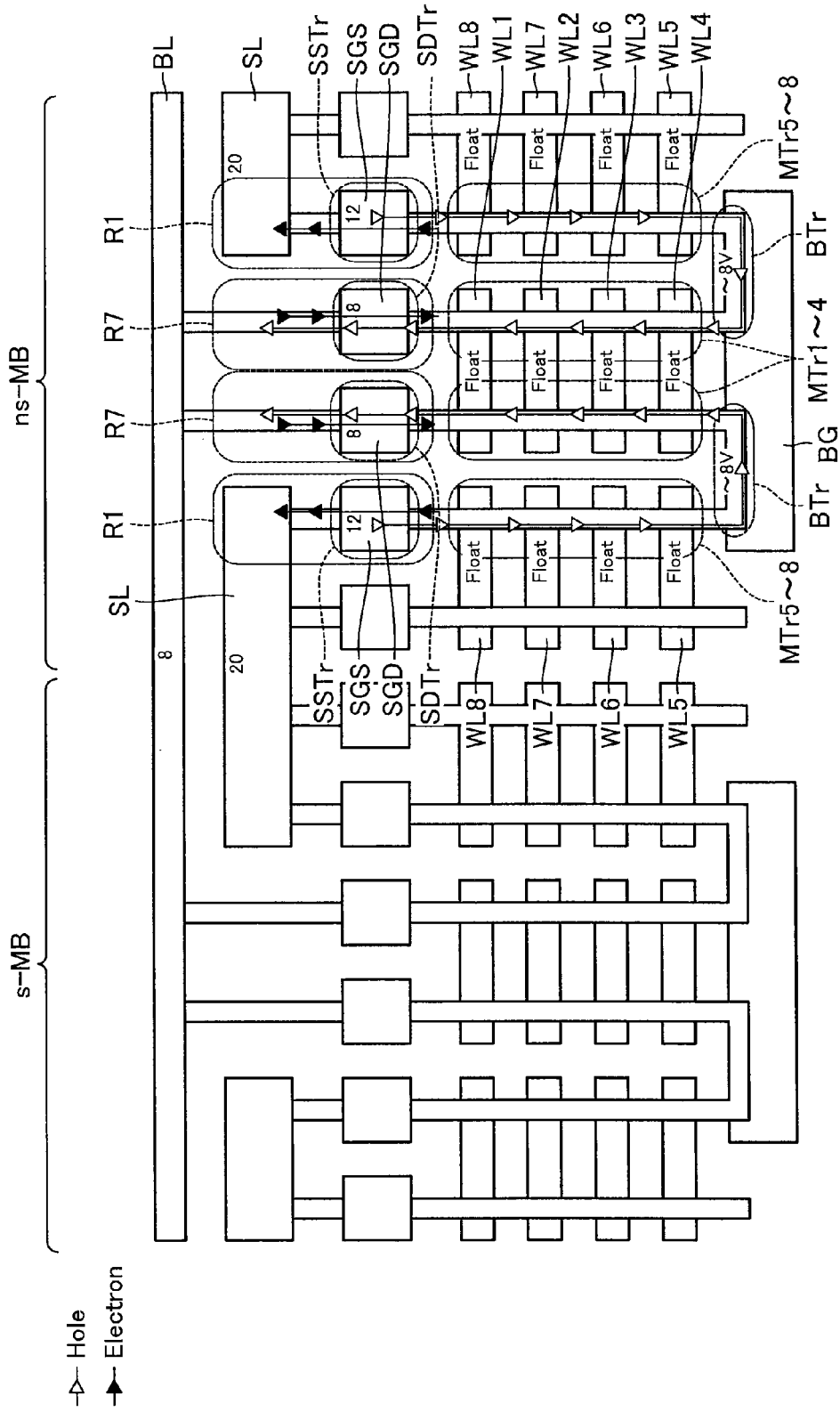
FIG. 26 is a diagram showing one example of prohibiting an erasing operation on a non-selected memory block ns-MB according to a fifth embodiment.

According to the fifth embodiment, the control circuit 2 generates a GIDL current in a non-selected memory block ns-MB as shown in FIG. 26. The fifth embodiment is different from the fourth embodiment in this point. Specifically, as shown in regions R1 of FIG. 26, the control circuit 2 sets the voltage VSL of the source lines SL to 20 V, and the voltage VSGS of the gates of the source-side select transistors SSTr to 12 V. That is, the voltage VSL of the source lines SL becomes higher than the voltage VSGS of the gates of the source-side select transistors SSTr by a voltage α(VSL−Vα=VSGS). As a result, a GIDL current is generated in the regions R1 shown in FIG. 26.

Figure 27:
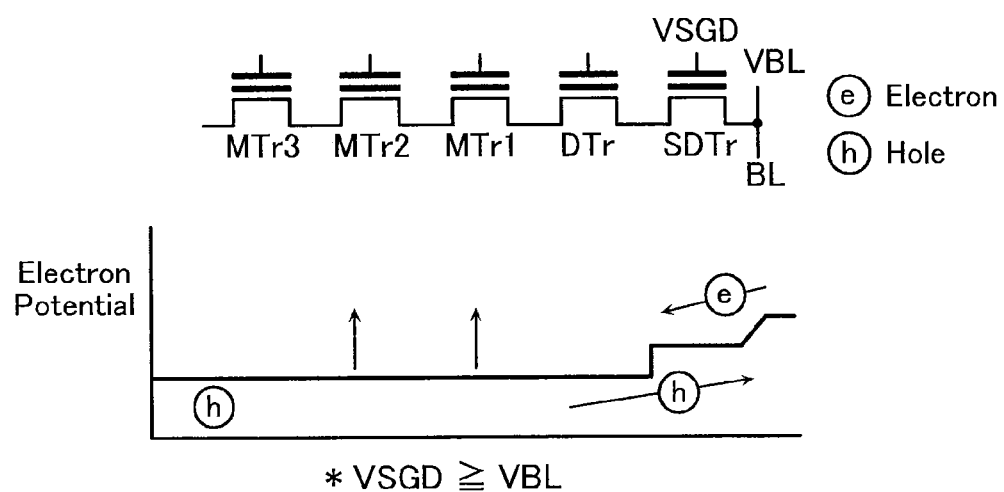
FIG. 27 is a diagram showing potential in region R7 of FIG. 26.

Further, as shown in regions R7 of FIG. 26, the control circuit 2 sets the voltage VSGD of the gates of the drain-side select transistors SDTr to 8 V, and the voltage VBL of the bit line BL to 8 V. That is, the voltage VSGD of the gates of the drain-side select transistors SDTr becomes equal to or higher than the voltage VBL of the bit line BL. In this case, in the regions R7 of FIG. 26, electron potential becomes as shown in FIG. 27. This allows migration of holes from the cell units MU to the bit line BL. This also allows migration of electrons from the bit line BL to the cell units MU.

The above-described control on the regions R1 and R7 of FIG. 26 causes the voltage of the bodies of the memory transistors MTr1 to MTr7 in the non-selected memory block ns-MB to be raised to 8 V. However, because the control circuit 2 has the word liens WL1 to WL7 set in a floating state, the charge accumulation layers of the memory transistors MTr1 to MTr7 in the non-selected memory block ns-MB are prevented from being applied with a high voltage. Hence, an erasing operation on the non-selected memory block ns-MB is prohibited.

The erasing operation according to the fifth embodiment can be executed by means of the control circuit 2 according to the fourth embodiment shown in FIG. 25.

Sixth Embodiment

Next, an erasing operation of a nonvolatile semiconductor memory device according to a sixth embodiment will be explained with reference to FIG. 28. The configuration of the memory cell array 1 according to the sixth embodiment is the same as the fourth embodiment. On the other hand, control on a non-selected memory block ns-MB according to the sixth embodiment is different from the fourth embodiment. Any components of the sixth embodiment that are the same as the first to fifth embodiment will be denoted by the same reference numerals and explanation thereof will be omitted.

According to the fourth embodiment described above, in a non-selected memory block ns-MB, the control circuit 2 sets the voltage VSGD of the gates of the drain-side select transistors SDTr to 20 V (see FIG. 24). As compared with this, according to the sixth embodiment, in a non-selected memory block ns-MB, the control circuit 2 sets the voltage VSGD of the gates of the drain-side select transistors SDTr to 8 V as shown in FIG. 28. The sixth embodiment is different from the fourth embodiment in this point. This allows migration of electrons from the cell units MU to the source lines SL in the regions R3 shown in FIG. 28, like in the fourth embodiment. This also allows migration of electrons from the cell units MU to the bit line BL in the regions R4 of FIG. 28.

Figure 28:
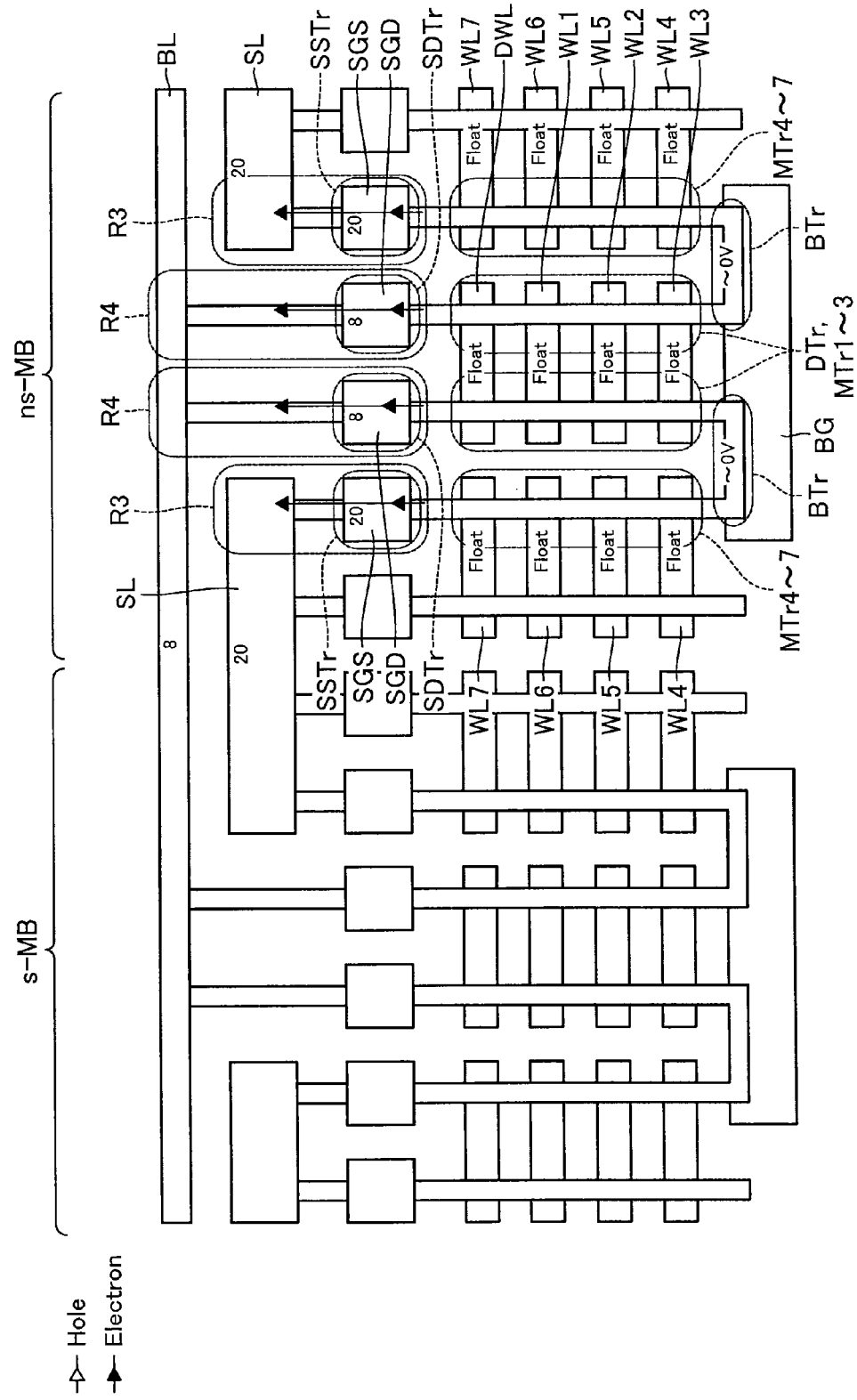
FIG. 28 is a diagram showing one example of prohibiting an erasing operation on a non-selected memory block ns-MB according to a sixth embodiment.

The above-described control on the regions R3 and R4 of FIG. 28 causes the voltage of the bodies of the memory transistors MTr1 to MTr7 in the non-selected memory block ns-MB to be set to 0 V. Hence, according to the sixth embodiment, an erasing operation on the non-selected memory block ns-MB is prohibited. Furthermore, the sixth embodiment can save power consumption as compared with the fourth embodiment, because the sixth embodiment reduces the voltages to be applied to the gates to 8 V.

Figure 29:
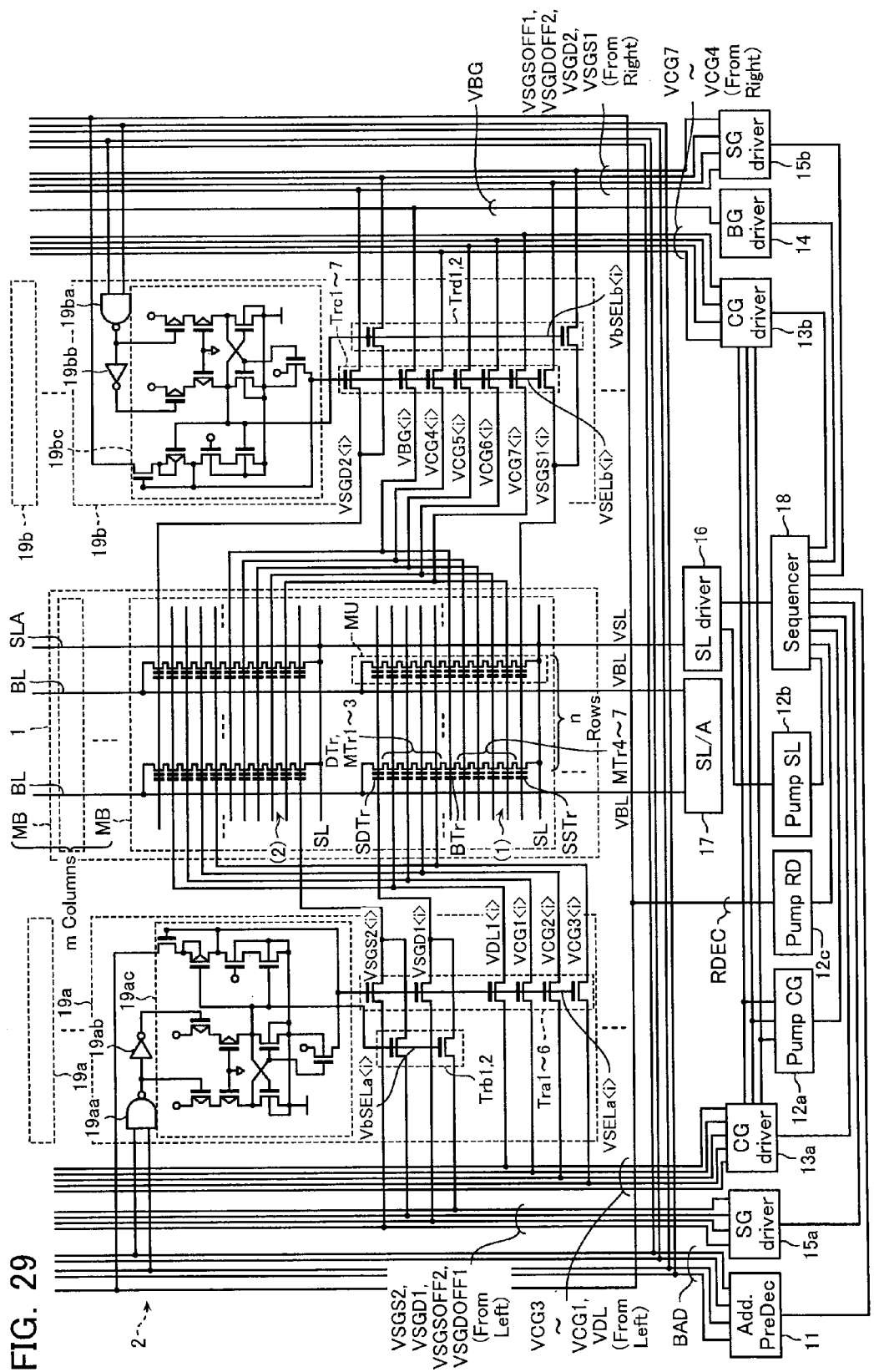
FIG. 29 is a circuit diagram showing a control circuit 2 according to the sixth embodiment

A specific configuration of the control circuit 2 capable of executing the above-described erasing operation according to the sixth embodiment will be explained with reference to FIG. 29. Being different from the fourth embodiment, the control circuit 2 according to the sixth embodiment is configured to be capable of applying different voltages to the drain-side select gate lines SGD located in the first column and the second column of the non-selected memory block ns-MB respectively. Hence, in the control circuit 2 according to the sixth embodiment, output signals of the select gate line driver circuits 15a and 15b are different from the fourth embodiment, as shown in FIG. 29.

The select gate line driver circuit 15a outputs signals VSGDOFF1 and VSGSOFF2 instead of the signal VSGOFF of the fourth embodiment. The select gate line driver circuit 15b outputs signals VSGDOFF2 and VSGSOFF1 instead of the signal VSGOFF.

The signals VSGSOFF1 and VSGSOFF2 are used for driving the source-side select gate lines SGS located in the first and second columns of the non-selected memory block ns-MB respectively. The signal VSGSOFF1 is supplied to one end of a second transfer transistor Trd1. The signal VSGOFF2 is supplied to one end of a second transfer transistor Trb1.

The signals VSGDOFF1 and VSGDOFF2 are used for driving the drain-side select lines SGD located in the first and second columns of the non-selected memory block ns-MB respectively. The signal VSGDOFF1 is supplied to one end of a second transfer transistor Trb2. The signal VSGDOFF2 is supplied to one end of a second transfer transistor Trd2. The erasing operation according to the sixth embodiment can be executed by means of the circuit shown in FIG. 29.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, shown in the region R4 of FIG. 23 according to the fourth embodiment is an example of setting the voltage VSGD of the gate of the drain-side select transistor SDTr included in a non-selected cell unit ns-MU to 8 V. However, even in this case, there is a risk that the voltage of the bodies of the memory transistors MTr1 to MTr7 included in the non-selected cell unit ns-MU might rise to cause erroneous erasing.

Figure 30:
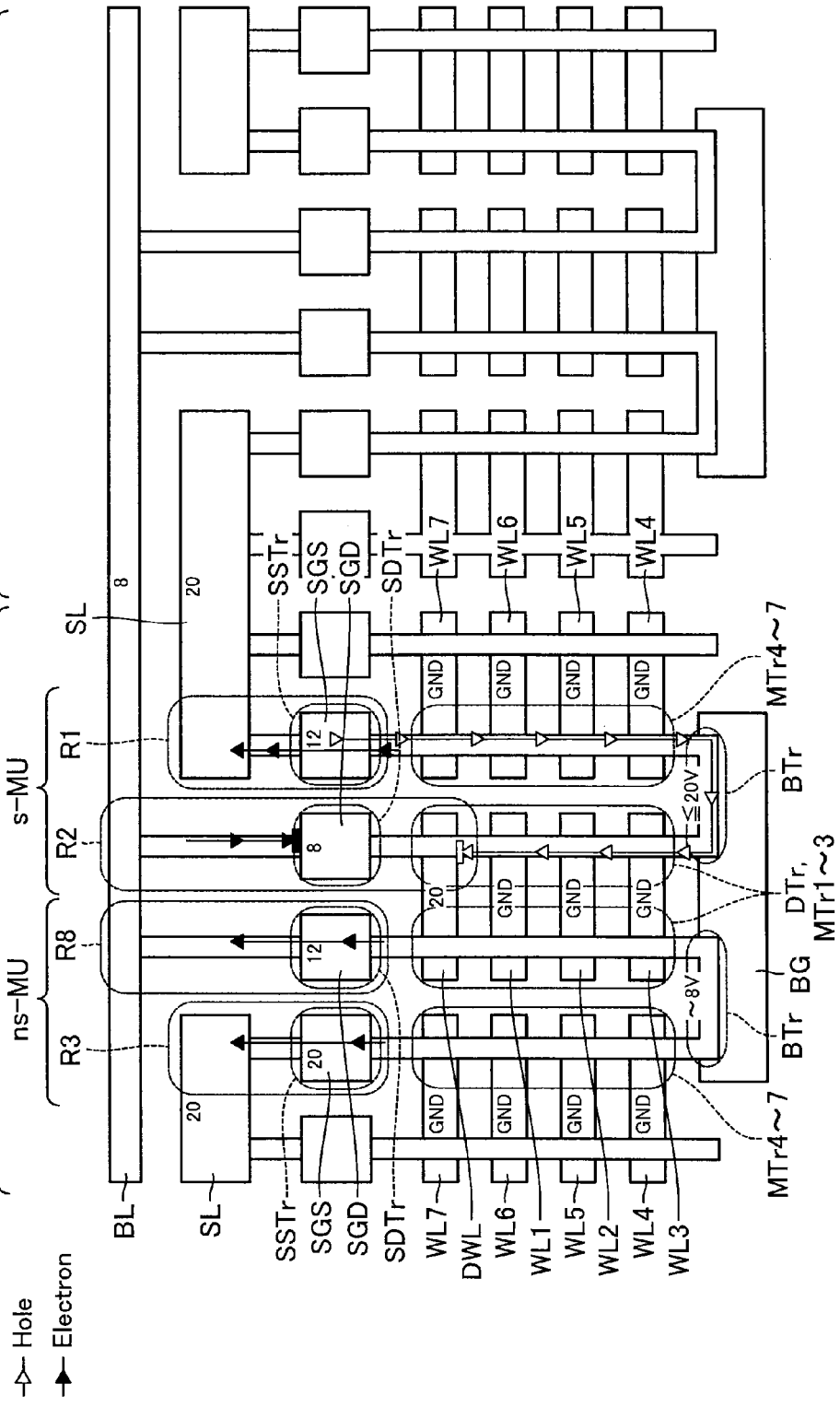
FIG. 30 is a diagram showing one example of executing an erasing operation on a selected cell unit s-MU in a selected memory block s-MB according to a modified example of the fourth embodiment.
Figure 31:
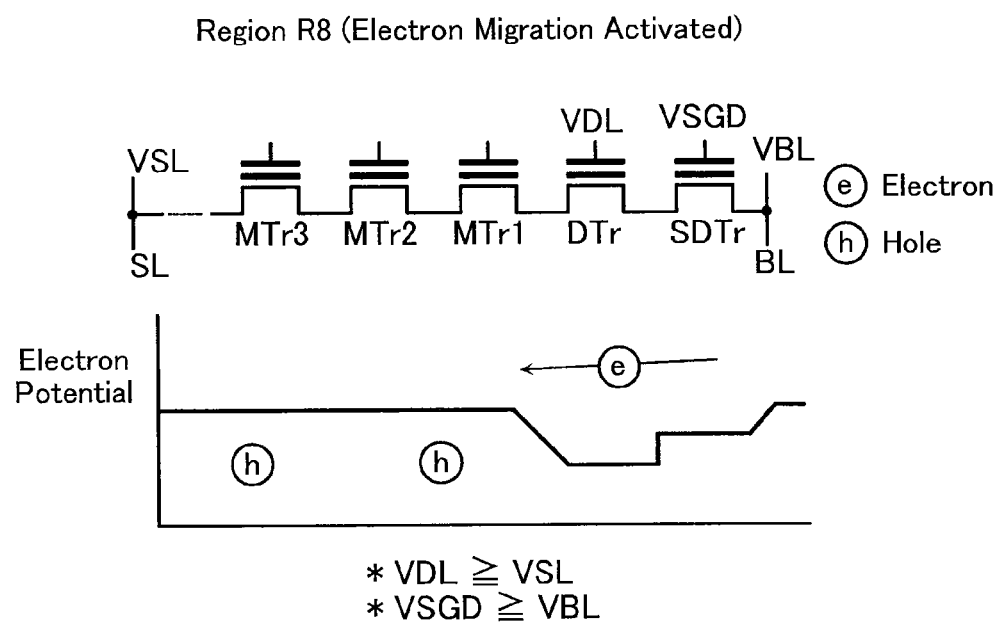
FIG. 31 is a diagram showing potential of a region R8 of FIG. 30.

Hence, as shown in a region R8 of FIG. 30, the control circuit 2 may set the voltage VSGD of the gate of the drain-side select transistor SDTr included in the non-selected cell unit ns-MU to 12 V. In this case, in the region R8 shown in FIG. 30, electron potential becomes as shown in FIG. 31. This allows migration of electrons from the bit line BL to the non-selected cell unit ns-MU when the voltage of the bodies of the memory transistors MTr1 to MTr7 included in the non-selected cell unit ns-MU exceeds a certain voltage (for example, 8 V). Hence, the control shown in FIG. 30 can suppress the voltage of the bodies of the memory transistors MTr1 to MTr7 included in the non-selected cell unit ns-MU from rising, thereby suppressing occurrence of erroneous erasing.

In the non-selected memory block ns-MB according to the fourth and fifth embodiments, the voltage VBL of the bit line BL may be set to 20 V, and the voltage VSL of the source lines SL may be set to 8 V. In the non-selected memory block ns-MB according to the sixth embodiment, the voltage VBL of the bit line BL and the voltage VSGD of the gates of the drain-side select transistors SDTr may be set to 20 V, and voltage VSL of the source lines SL and the voltage VSGS of the gates of the source-side select transistors SSTr may be set to 8 V.

What is claimed is:

1. A nonvolatile semiconductor memory device comprising:
    a memory cell array including a first block, the first block including a plurality of first units, each of the plurality of first units including a plurality of first memory strings, each first memory string including a first memory cell, a second memory cell, a first selection transistor, and a second selection transistor, the first memory cell being electrically connected to the second memory cell in series, the first selection transistor being electrically connected to the first memory cell in series, the second selection transistor being electrically connected to the second memory cell in series, gates of the first memory cells in the first block being electrically connected, gates of the second memory cells in the first block being electrically connected; and
    a controller configured to perform an erase operation per the first unit.

2. The device according to claim 1, wherein the controller is configured to perform an erase operation per the first block.

3. The device according to claim 1, wherein the plurality of first memory cells and the plurality of second memory cells in the first block are stacked in a first direction perpendicular to a semiconductor substrate.

4. The device according to claim 1, further comprising:
    a first source line electrically connected to a first first unit of the plurality of first units;
    a second source line electrically connected to a second first unit, the second first unit being different from the first first unit; and
    wherein the controller is configured to perform the erase operation for the first first unit on a condition that a first voltage is applied to the first source line, a second voltage is applied to the second source line, and the first voltage is higher than the second voltage.

5. The device according to claim 4, wherein the first source line is electrically connected to the second selection transistor in the first first unit, the second source line is electrically connected to the second selection transistor in the second first unit,
    wherein the controller is configured to perform the erase operation for the first unit on a condition that a third voltage is applied to a gate of the second selection transistor in the first unit and the third voltage is lower than the first voltage.

6. The device according to claim 5, further comprising:
    a second block including a plurality of second units, each of the plurality of second units including a plurality of second memory strings, each second memory string including a third memory cell, a fourth memory cell, a third selection transistor, and a fourth selection transistor, the third memory cell being electrically connected to the fourth memory cell in series, the third selection transistor being electrically connected to the third memory cell in series, the fourth selection transistor being electrically connected to the fourth memory cell in series, gates of the third memory cells in the second block being electrically connected, gates of the fourth memory cells in the second block being electrically connected; and
    wherein the controller is configured to perform the erase operation for the first unit on a condition that a fourth voltage is applied to gates of both the third selection transistor and the fourth selection transistor and the fourth voltage is substantially same as the first voltage.

7. The device according to claim 6, wherein the second memory transistor includes a charge storage layer.

* * * * *